United States Patent
Goebel et al.

(10) Patent No.: US 6,586,795 B2
(45) Date of Patent: Jul. 1, 2003

(54) DRAM CELL CONFIGURATION WHOSE MEMORY CELLS CAN HAVE TRANSISTORS AND CAPACITORS WITH IMPROVED ELECTRICAL PROPERTIES

(75) Inventors: Bernd Goebel, Dresden (DE); Emmerich Bertagnolli, Vienna (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/873,659

(22) Filed: Jun. 4, 2001

(65) Prior Publication Data

US 2002/0017671 A1 Feb. 14, 2002

Related U.S. Application Data

(63) Continuation of application No. PCT/DE99/03840, filed on Dec. 1, 1999.

(30) Foreign Application Priority Data

Dec. 2, 1998 (DE) .......................... 198 55 688

(51) Int. Cl.[7] .......................................... H01L 21/8242
(52) U.S. Cl. ...................... 257/302; 438/243; 257/303
(58) Field of Search ................................. 257/296, 300, 257/301, 302; 438/242, 243, 244, 246, 386, 387, 389

(56) References Cited

U.S. PATENT DOCUMENTS

| | | | |
|---|---|---|---|
| 5,008,214 A | | 4/1991 | Redwine |
| 5,177,576 A | * | 1/1993 | Kimura et al. ............... 257/302 |
| 5,208,657 A | | 5/1993 | Chatterjee et al. |
| 5,316,962 A | * | 5/1994 | Matsuo et al. ............... 438/242 |
| 5,529,944 A | * | 6/1996 | Rajeevakumar ............. 438/242 |
| 5,753,526 A | * | 5/1998 | Ozaki .......................... 438/246 |
| 5,831,301 A | * | 11/1998 | Horak et al. ................. 257/296 |
| 6,225,158 B1 | * | 5/2001 | Furukawa et al. ........... 438/242 |

FOREIGN PATENT DOCUMENTS

| | | |
|---|---|---|
| DE | 19620625 C1 * | 5/1996 |
| EP | 0 272 476 A2 | 6/1988 |
| EP | 0 463 389 A1 | 1/1992 |
| JP | 63240061 A | 10/1988 |
| JP | 05291528 A | 11/1993 |

OTHER PUBLICATIONS

IBM: "Densest Dram Cell", IBM Technical Disclosure Bulletin, vol. 32, No. 9A, Feb. 1990, pp. 380–382, ISNN 0018–8689.

* cited by examiner

Primary Examiner—Wael Fahmy
Assistant Examiner—Hoai V. Pham
(74) Attorney, Agent, or Firm—Laurence A. Greenberg; Werner H. Stemer; Gregory L. Mayback

(57) ABSTRACT

Memory cells each include one transistor and one capacitor. A memory node of the capacitor is disposed in a first indentation, while a gate electrode of the transistor is disposed in a second indentation. An upper source/drain region, a channel region, and a lower source/drain region of the transistor are disposed above one another and each adjoin both a first flank of the first indentation and the second indentation. At least a portion of the first flank is provided with a capacitor dielectric, which in the region of the lower source/drain region has a recess, in which the memory node adjoins the lower source/drain region. The second indentation of a first one of the memory cells can adjoin the memory node that is disposed in the first indentation of a second one of the memory cells. The second indentations can be parts of word line trenches, which extend transversely to insulation trenches. Above the recess, an insulating structure is preferably disposed in the first indentation and adjoins two adjacent ones of the insulation trenches.

33 Claims, 28 Drawing Sheets

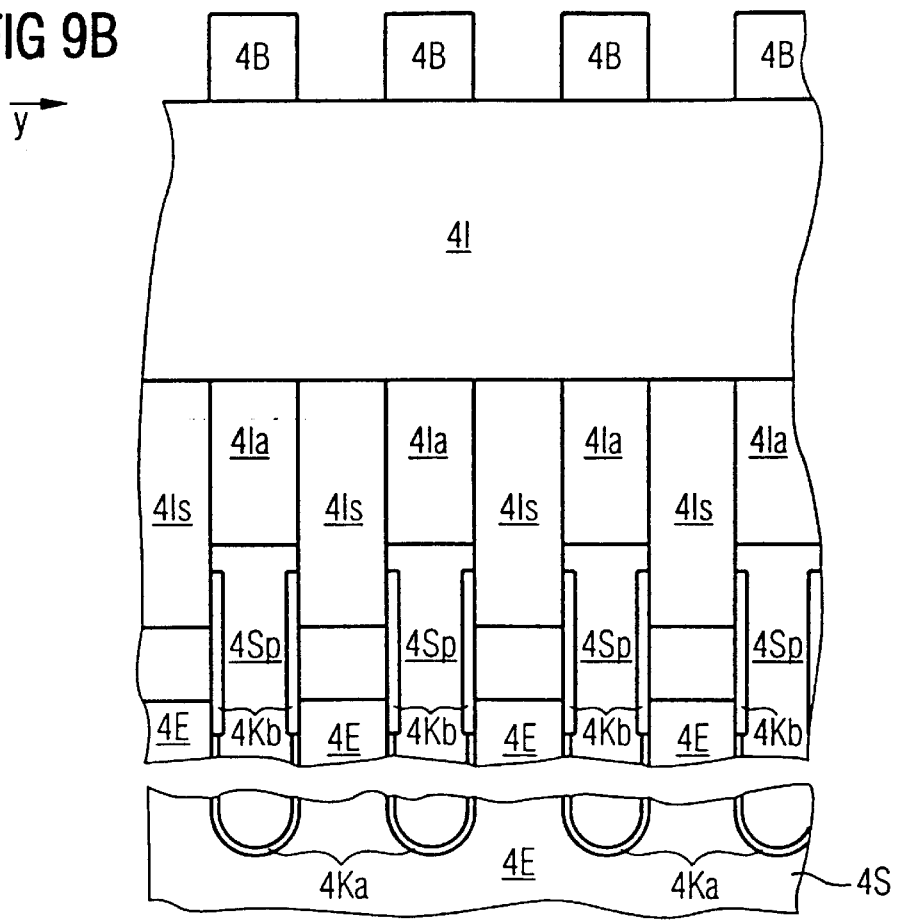
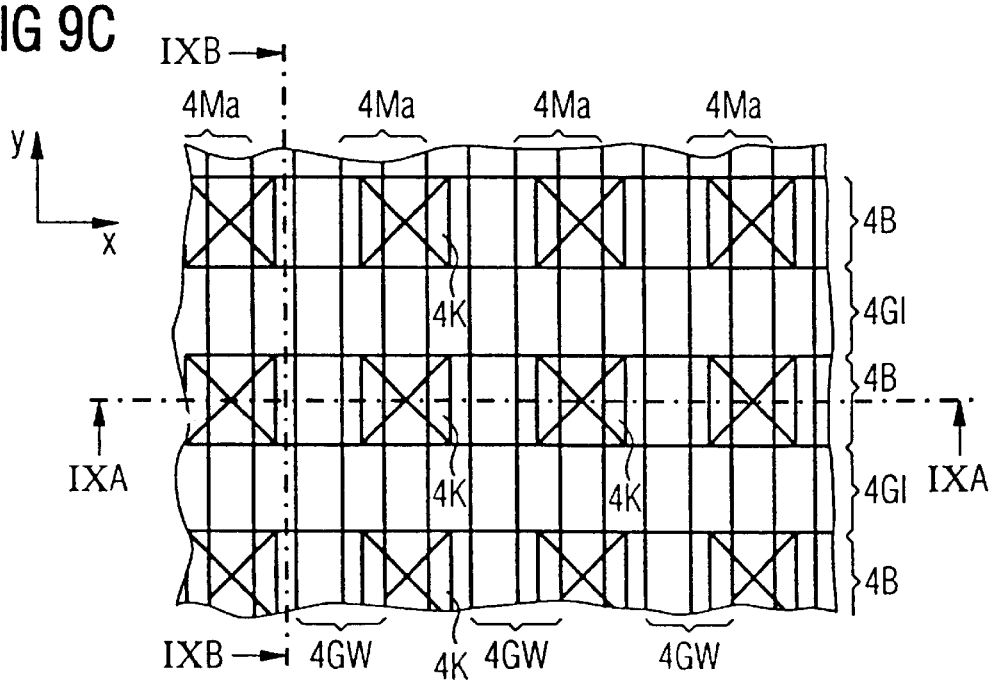

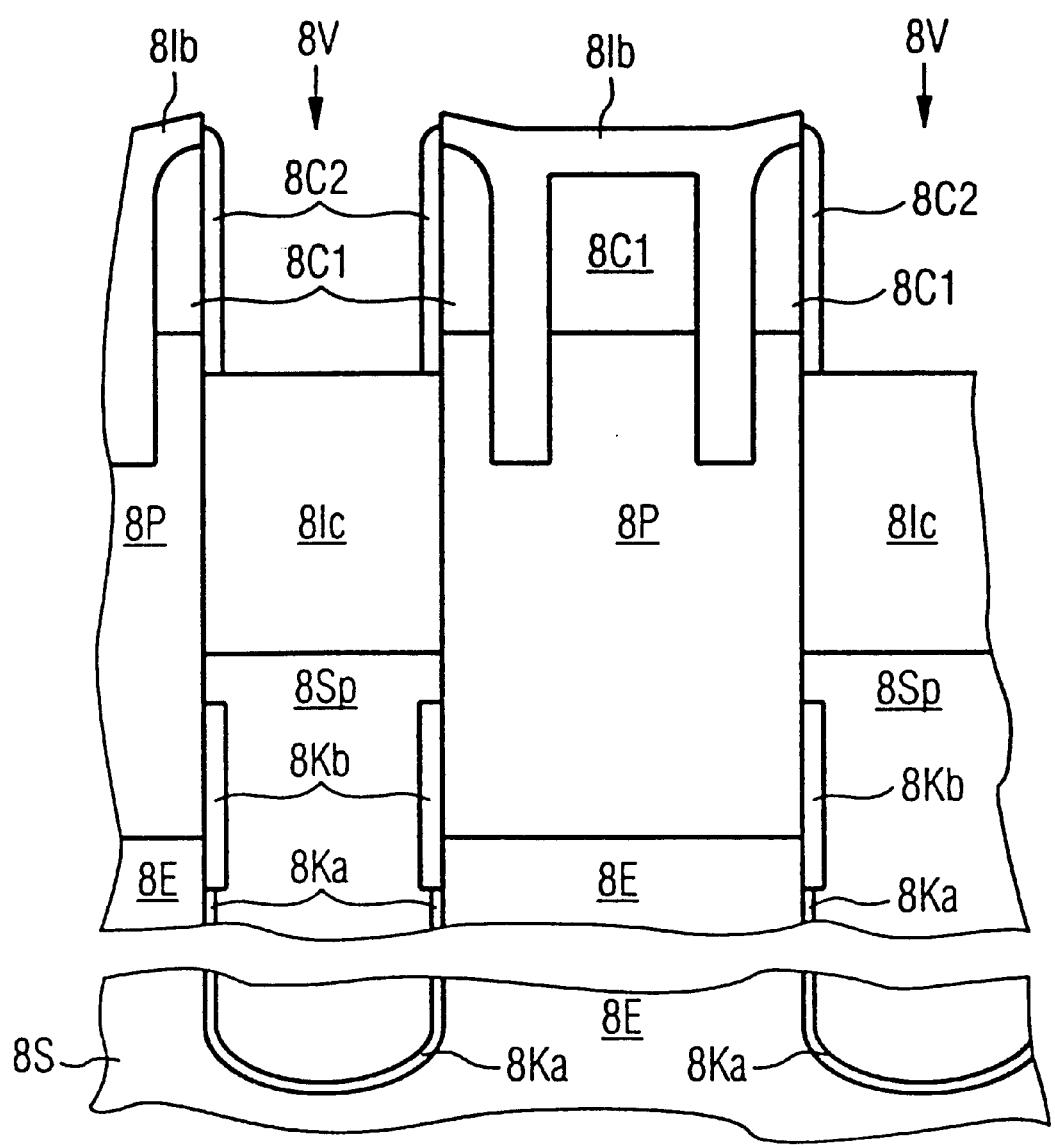

DRAM CELL CONFIGURATION WHOSE MEMORY CELLS CAN HAVE TRANSISTORS AND CAPACITORS WITH IMPROVED ELECTRICAL PROPERTIES

CROSS-REFERENCE TO RELATED APPLICATION

This is a continuation of copending International Application PCT/DE99/03840, filed Dec. 1, 1999, which designated the United States.

BACKGROUND OF THE INVENTION

Field of the Invention

The invention relates to a DRAM cell configuration, that is, to an array of memory cells with dynamic random access, and to a method for producing the configuration.

For a memory cell of a DRAM cell configuration, at present almost exclusively a so-called one-transistor memory cell is used, which includes one transistor and one capacitor. The information in the memory cell is stored in the form of a charge on the capacitor. The capacitor is connected to the transistor, so that when the transistor is triggered via a word line, the charge of the capacitor can be read out via a bit line.

The general goal is to create a DRAM cell configuration that has a high packing density.

U.S. Pat. No. 5,208,657 describes a DRAM cell configuration in which a memory cell includes a transistor and a capacitor. To increase the packing density, the transistor is disposed on four flanks of an indentation in which a memory node of the capacitor is disposed. The indentation is disposed below a region in which a word line and a bit line of the memory cell intersect. The transistor is embodied as a vertical transistor, and its gate electrode is disposed in the indentation above the memory node. The space required for the memory cell is at least 6.25 F, where F is the minimum feature size feasible in the production technology employed.

SUMMARY OF THE INVENTION

The object of the present invention is to provide a DRAM cell configuration and a production method which overcome the above-noted deficiencies and disadvantages of the prior art devices and methods of this general kind, and whereby the invention provides for a DRAM cell configuration whose memory cells can have transistors and capacitors with improved electrical properties compared with the prior art, without having to reduce the packing density of the DRAM cell configuration. It is a further object to provide for a method for producing such a DRAM cell configuration.

With the above and other objects in view there is provided, in accordance with the invention, a DRAM cell configuration, comprising:
- a substrate and memory cells each including at least one vertical transistor and one capacitor, a first indentation and a second indentation;
- said first indentation and said second indentation being laterally offset from one another, with said second indentation of a first memory cell adjoining said first indentation of an adjacent, second memory cell and adjoining said substrate;
- an upper source/drain region, a channel region, and a lower source/drain region of said transistor being disposed in said substrate, one above the other, and each adjoining a first flank of said first indentation and adjoining said second indentation;
- a capacitor dielectric of said capacitor formed on at least a portion of said first flank of said first indentation, said dielectric having a recess formed therein in a region of said lower source/drain region of said transistor, and wherein a bottom of said second indentation is located lower than a lower edge of said recess;
- said capacitor having a memory node disposed in said first indentation, and said node in said recess adjoining said lower source/drain region of said transistor;
- said transistor having a gate electrode disposed in said second indentation; and
- a word line connected to said gate electrode of said transistor of said memory cell, and a bit line extending transversely to said word line and connected to said upper source/drain region.

In other words, the objects of the invention are attained by a DRAM cell configuration which has memory cells that each include at least one vertical transistor and one capacitor. An upper source/drain region, a channel region, and a lower source/drain region of the transistor are disposed one above the other, and each adjoins both a first flank of the first indentation and the second indentation. At least a portion of the first flank of the first indentation is provided with a capacitor dielectric of the capacitor, which dielectric has a recess in the region of the lower source/drain region of the transistor. A memory node of the capacitor is disposed in the first indentation, and in the recess this node adjoins the lower source/drain region. A gate electrode of the transistor is disposed in the second indentation.

The memory cells are connected to word lines and to bit lines that extend transversely to the word lines.

The object is also attained by a method for producing a DRAM cell configuration, in which memory cells are created, which each have one vertical transistor and one capacitor. As parts of the transistor in the substrate, a lower source/drain region, a channel region, and an upper source/drain region are created, so that they are disposed one above the other. In the substrate, a first indentation is created, which with a first flank adjoins the lower source/drain region, the channel region, and the upper source/drain region. The first indentation is provided with a capacitor dielectric of the capacitor. The capacitor dielectric is provided with a recess on the first flank of the first indentation, in the region of the lower source/drain region. In the first indentation, a memory node of the capacitor is created, which in the recess adjoins the lower source/drain region. A second indentation is created that adjoins the upper source/drain region, the channel region, and the lower source/drain region. A gate electrode of the transistor is created in the second indentation. Word lines and bit lines, which extend transversely to the word lines, are created and connected to the memory cells.

The second indentation of the memory cell is located outside the first indentation of the memory cell.

The DRAM cell configuration can have a high packing density, since the transistor is designed as a vertical transistor, the memory node is disposed in an indentation, and a connection between the memory nodes and the lower source/drain region is made possible by means of a recess of the capacitor dielectric, which requires no additional space.

The quality of a boundary layer of the channel region, where a gate dielectric of the transistor is created, generally has a great influence on electrical properties of the transistor. It is consequently advantageous to produce this boundary layer with special care. In comparison to U.S. Pat. No. 5,208,657, the transistor can be produced with improved electrical properties, since different indentations are provided for the capacitor and for the transistor, and so the boundary layer of the channel region can remain spared from process steps for creating the first indentation.

The provision of two different indentations furthermore offers the advantage that the geometry of the boundary layer of the channel region can be independent of any geometry of a face at which the capacitor dielectric is created. The boundary layer of the channel region is preferably flat, so that it has a defined orientation with regard to the crystal lattice of the substrate, so that the gate dielectric can grow homogeneously. The face in which the capacitor dielectric is created is conversely preferably curved, so that the capacitor dielectric has no edges where field distortions could lead to leakage currents. Both the transistor and the capacitor can have especially good electrical properties.

A horizontal cross section through the first indentation is circular or elliptical, for instance.

To increase the packing density, it is advantageous if the first indentations and the second indentations of the memory cells are disposed such that the second indentation of a first one of the memory cells adjoins the memory node which is disposed in the first indentation of a second one of the memory cells. The memory cells are immediately adjacent one another or overlap.

To simplify the process, it is advantageous if the memory node is created at least at first such that at least also at a second flank of the first indentation, which flank is opposite the first flank of the first indentation, in the region of a further recess, it adjoins the substrate.

The capacitor dielectric is deposited essentially conformally, for instance after the first indentation has been created, so that faces of the first indentation are covered without the first indentation being filled. Next, the first indentation is filled with conductive material. The conductive material is etched back to a lower level. Next, exposed parts of the capacitor dielectric are removed. By deposition of further conductive material, the first indentation is re-filled. Next, the conductive material is back-etched to an upper level, which is located above the lower level. In this way, not only is the recess of the capacitor dielectric created at the first flank of the first indentation between the lower level and the upper level, but the further recess of the capacitor dielectric is in particular also created at the second flank of the first indentation. If the first indentation with further flanks between the upper level and the lower level adjoins the substrate, then recesses are created at these flanks as well. The memory node is created from the conductive material.

The conductive material is for example doped silicon.

A further possible way of creating the memory node is, after deposition of the capacitor dielectric, to fill the first indentation with conductive material and to etch the conductive material back to the upper level. Next, by isotropic etching, exposed parts of the capacitor dielectric and parts of the capacitor dielectric that are disposed between the upper level and the lower level are removed. By deposition and back-etching of further conductive material, a gap between the conductive material and the substrate is filled. As the further conductive material, amorphous doped silicon is especially suitable, because it can be conformally deposited well and causes no defects in the adjoining substrate.

To create the lower source/drain region, a tempering step is performed, in which at least in the region of the recess, dopant from the memory node diffuses into the substrate.

Alternatively, the lower source/drain region is created by structuring a doped layer of the substrate.

A middle layer, doped by a first conductivity type, can be disposed between two layers doped with a second conductivity type that is opposite the first conductivity type. The layers can be created by in situ doped epitaxy or by implantation. The channel region is created from the middle layer, and the upper source/drain region and the lower source/drain region are created from the other layers. This has the advantage that a channel length of the transistor can be set precisely, since the process precision with regard to the thickness of the layers, especially in epitaxy, is low. If an implantation is performed, this can also be done after the indentations have been created.

To reduce leakage currents, it is advantageous if a low-doped part of the lower source/drain region is created by structuring the doped layer, and if a highly doped part of the lower source/drain region is created by diffusion of dopant out of the memory node. The low-doped part surrounds the highly doped part in such a way that the highly doped part does not adjoin either the substrate or the channel region. This kind of DRAM cell configuration has soft p-n junctions and consequently less leakage current, since only the low-doped part of the lower source/drain region adjoins the channel region and the substrate.

It is within the scope of the invention if the highly doped part does adjoin the channel region but not the substrate, or does adjoin the substrate but not the channel region.

To increase the packing density, it is advantageous if the memory node at the second flank of the first indentation does not adjoin the substrate. This makes it possible to lessen a spacing between adjacent first indentations without causing leakage currents between the associated memory nodes.

To create this kind of memory node, it is within the scope of the invention to prevent the embodiment of the further recess, by applying a mask that covers the second flank before the exposed parts of the capacitor dielectric are removed.

To simplify the process, it is advantageous by comparison if the memory node is first created such that it also adjoins the substrate at the second flank of the first indentation. The second indentation is created such that its bottom is located lower than a lower edge of the recess. At the second flank of the first indentation of the second memory cell, the second indentation separates the memory node of the second memory cell from the substrate. Consequently the creation of a mask to prevent the further recess can be dispensed with, and at the same time a high packing density is attained.

If the spacing between the first indentations is small, then doped regions created in the out-diffusion can grow together, so that the lower source/drain region is created in the form of a layer that at first extends from the first indentation of the first memory cell to the first indentation of the second memory cell. By the creation of the second indentation, the lower source/drain region is structured such that it no longer adjoins the first indentation of the second memory cell and thus no longer adjoins the memory node of the second memory cell.

It is advantageous if an upper face of the memory node is located in the region of the recess, that is, at its upper edge, and if an insulating structure is disposed in the first indentation on the memory node.

Since the memory node does not extend higher, or for instance does not extend as far as a surface of the substrate, a capacitance between the memory node and the upper source/drain region or the channel region or the lower source/drain region of the transistor is avoided. Furthermore, the insulating structure makes it possible to reduce the size of a boundary face between the memory node of the second memory cell and the second indentation of the first memory cell, so that a capacitance between the gate electrode of the first memory cell, or a word line that is disposed partly in the second indentation of the first memory cell, and the memory node of the second memory cell is decreased. This is especially advantageous whenever the second indentation is provided with a gate dielectric before the gate electrode is created; otherwise, no additional, thicker insulating structure that reduces the capacitance is provided on relatively large parts of the boundary face in the second indentation.

It is advantageous if the second indentation of the first memory cell is laterally offset from the first indentation of the second memory cell, so that the second indentation of the first memory cell is disposed partly in the first indentation of the second memory cell and partly in the substrate. A width of the insulating structure is at least large enough that triggering of the transistor of the second memory cell by the gate electrode of the first memory cell and/or by the word line, which is located partly in the second indentation of the first memory cell, is prevented. As a result of the overlap of the two memory cells, the DRAM cell configuration can be produced with a high packing density. Both the first indentation and the second indentation can be created with masks, which have a width of only F, where F is the minimum feature size feasible in the technology employed. A spacing between first indentations can amount to F. A spacing between the second indentation and the first indentation of the same memory cell can be less than F.

With the above and other objects in view there is also provided, in accordance with the invention, a method of producing a DRAM cell configuration as outline above, comprising:

forming a first indentation and a second indentation in a substrate, with the first indentation and the second indentation laterally offset from one another;
  forming memory cells, each with a vertical transistor and a capacitor, and wherein the second indentation of a first memory cell adjoins the first indentation of an adjacent second memory cell and adjoins the substrate;
  forming transistors in the substrate, with a lower source/drain region, a channel region, and an upper source/drain region disposed one above the other;
  wherein the first indentation is formed in the substrate such that a first flank of the first indentation adjoins the lower source/drain region, the channel region, and the upper source/drain region;
  forming a capacitor dielectric of a capacitor in the first indentation;
  providing the capacitor dielectric with a recess on the first flank of the first indentation, in a region of the lower source/drain region;
  creating a memory node of the capacitor in the first indentation, wherein the node in the recess adjoins the lower source/drain region;
  wherein the second indentation is formed to adjoin the upper source/drain region, the channel region, and the lower source/drain region, and a bottom of the second indentation is located lower than a lower edge of the recess;
  forming a gate electrode of the transistor in the second indentation;
  creating a word line and a bit line extending transversely to the word line; and
  connecting the gate electrode of the transistor to the word line, and connecting the upper source/drain region to the bit line.

In other words, to create this kind of DRAM cell configuration, first at least the channel region and the lower source/drain region of the transistor of the first memory cell can be created such that before the second indentation of the first memory cell is created, they adjoin the first indentation of the first memory cell and the first indentation of the second memory cell. After the capacitor dielectric is created and the conductive material is deposited, a mask is created, which is disposed above the first flanks of the first indentations but does not cover regions above the second flanks of the first indentations. The second indentation is created with the aid of a mask, and both at least the substrate and the conductive material are etched. The conductive material is structured by means of the second indentation, creating the memory node. It is within the scope of the invention if before the second indentation is created, the upper source/drain region also adjoins the first indentation of the first memory cell and the first indentation of the second memory cell.

It is within the scope of the invention if the second indentation of the first memory cell is disposed in the substrate and outside the first indentation of the second memory cell and adjoins the second flank of the first indentation of the second memory cell. To that end, in the creation of the second indentation with the aid of a mask which is disposed above the first flanks of the first indentations, the substrate is etched.

In this case, in the finished DRAM cell configuration as well, the capacitor dielectric can have the further recess, so that the second indentation of the first memory cell adjoins the memory node of the second memory cell in the region of the further recess.

For creating such a DRAM cell configuration, first a mask can be created that covers the first indentations that are to be created. Between the first indentations that are to be created, trenches are created by making spacers at flanks of the mask, and the substrate is etched selectively to the mask and to the spacers. The trenches are filled with insulating material. Next, material is deposited and back-etched, so that the material is located between parts of the mask. The mask is removed, and the first indentations are created by etching the substrate selectively to the material. The substrate is covered with the insulating material. A portion of the substrate that adjoins the first flank of the first indentation of the first memory cell is exposed. The substrate is etched isotropically, and the trench filled with the insulating material acts as a lateral etch stop, so that in the substrate, a recess is created which adjoins the first flank of the first indentation of the first memory cell. The recess is filled with insulating material. The insulating material and the insulating structure are partly replaced by the mask for the second indentations, in that the insulating material and the insulating structure are back-etched and material is deposited and planarized, until a portion of the substrate is exposed that adjoins the second flank of the first indentation of the second memory cell and adjoins the trenches. The second indentations are created with the aid of this mask, by etching the substrate selectively to the material. An especially advantageous aspect of this method is that elongation of the substrate perpendicular to the plane of the channel can be adjusted precisely even if a spacing between adjacent first indentations amounts to no more than F. This elongation determines the threshold voltage of the transistor. In this case, it is defined by the width of the spacers, since the trenches are created between adjacent spacers, and since by acting as an etch stop the trenches determine how large a region covered by the mask for the second indentations is.

It is within the scope of the invention if the second indentation of the first memory cell is disposed in the first indentation of the second memory cell and together with the first indentation of the second memory cell shares a portion of the second flank of the first indentation of the second memory cell. In that case, the elongation of the substrate perpendicular to the plane of the channel is determined by a first mask, which is used to create the first indentations.

In a first possible way of creating a DRAM cell configuration of this kind, a first layer is placed on the substrate and structured in accordance with the first indentations. After the insulating structure has been created, a second layer is placed and structured such that it is disposed above the first flanks of the first indentations and does not cover the regions above second flanks, opposite the first flanks, of the first indentations. The first layer and the second layer act as a mask in the creation of the second indentations, in which the insulating structure and the conductive material begin to be etched. The first layer and the second layer comprise a material which can be etched selectively to the insulating structure. If the insulating structure is of SiO$_2$, then the first layer and the second layer can for instance comprise silicon nitride. It is advantageous if on the first layer, a layer that can be etched selectively to the second layer is created. On that layer, the second layer is created. The layer can act as an etch stop in the structuring of the second layer, so that the first layer is not attacked.

In a second possible way of creating a DRAM cell configuration of this kind, a layer is placed on the substrate and structured in accordance with the first indentations. Spacers are created at the first flanks of the first indentations. The second indentations are created by etching the conductive material selectively to the layer and the spacers. The spacers can be the insulating structures. Alternatively, the spacers are removed and replaced by the insulating structures. In both cases, a width of the second indentations is determined by the thickness of the spacers.

To enable reducing a minimum capacitance of the capacitor that is required because of background noise to read out the information from the memory cell, it is advantageous if the DRAM cell configuration has so-called folded bit lines. In folded bit lines, the signal of the bit line by way of which the information is read out is compared with the signal of a bit line, adjacent to the bit line, whose signal comprises background noise. In this way, the background noise can be filtered out. To assure that the signal of the adjacent bit line will comprise only background noise, no memory cell that is connected to the adjacent bit line can be allowed to be connected to the word line with which the memory cell to be read out is connected.

To make a DRAM cell configuration with folded bit lines possible with a high packing density at the same time, it is advantageous if the second indentation is part of a word line trench in which two different word lines are disposed. The gate electrode of the transistor is part of one of the word lines. To create the word lines, conductive material can be deposited and back-etched, creating the word lines in the form of spacers at the flanks of the word line trench. In this case it is especially advantageous if, as described above, the second indentation is disposed partly in the substrate and partly in the first indentation, since the second indentation can have a width of at least F and can simultaneously have a high packing density, so that there is sufficient space for the two word lines in the same word line trench.

To simplify the process, it is advantageous if only a single word line is disposed in the word line trench. In that case, the term used is "open bit lines."

To create a capacitor electrode of the capacitor, before the memory node is created a dopant source can be created in the first indentation, from which dopant diffuses into the substrate in a tempering step. The capacitor electrode is a doped region in the substrate and surrounds at least part of the first indentation. Arsenic glass, for instance, is suitable as a dopant source; it is deposited in such a way that faces of the first indentations are covered, but the first indentations are not filled. Next, the first indentations are filled with a polymer, such as photoresist, which is etched back to a level that is located below the level of the lower source/drain regions to be created. Next, exposed arsenic glass is removed. By means of a tempering step, arsenic diffuses out of the arsenic glass into the substrate. If a spacing between adjacent first indentations is sufficiently small, then adjacent capacitor electrodes grow together and form one common capacitor electrode.

The capacitor electrode can also be created by plasma immersion. In that process, ions of a plasma diffuse into the substrate. The common capacitor electrode can also be created as a doped layer of the substrate, before the first indentation is created. This layer is created for instance by epitaxy or by implantation.

If the lower source/drain region is created by diffusion of dopant, for instance out of the memory node, or by structuring of a doped layer of the substrate, and if word line trenches are provided, then it is advantageous if the upper source/drain region, at least part of the channel region, and the insulating structure are disposed in the direction of the word lines between two insulators. This prevents a word line in the word line trench of the first memory cell from triggering the transistor of the second memory cell, in the region of flanks of the first indentation that adjoin the first flank of the first indentation. The insulators prevent the upper source/drain region from adjoining the word line trench. The upper source/drain region, the channel region, and the lower source/drain region are disposed in the direction of the bit lines between the first indentation and the second indentation.

If the dopant source is used in the creation of the capacitor electrode, then it is advantageous for the insulators to be created after the memory nodes have been created, so that the insulators are not attacked when the dopant source is removed. To that end, after the first indentation is created, insulation trenches are created, which extend substantially parallel to one another and to the bit lines. The first indentation is intersected by two of the insulation trenches, which are adjacent to one another. To that end, both the substrate and material in the first indentation, such as the insulating structure, are etched. The intersecting of the first indentation assures that there is no left-over substrate is between one of the insulators and the first indentation. The transistor of the second memory cell is disposed exclusively at the first flank of the first indentation of the second memory cell and cannot be triggered by a word line of the second indentation of the first memory cell. The insulation trenches are filled with the insulators by deposition of insulating material. Next, word line trenches extending substantially parallel to one another are created, by etching at least both the substrate and the insulators.

The insulating structures can be created either before, after, or together with the insulators.

To increase the packing density, it is advantageous if a spacing between the two insulators amounts to F. To assure that the two insulators will intersect the first indentation despite imprecisions in the calibration of the insulators, a dimension of the first indentation parallel to the spacing between the two insulators amounts to more than F.

To increase the packing density, it is advantageous first to create the insulators and then to create the first indentation.

To assure that there is no substrate between the first indentation and the insulators, the first indentation is preferably created in self-calibrated fashion adjoining the insulators. To that end, with the aid of a striplike mask, whose strips extend transversely to the insulation trenches, the substrate is etched selectively to the insulators. In that case, a dimension of the first indentation parallel to the spacing between the insulators can amount to F. To prevent the insulators from being attacked by removal of the dopant source that is used to create the capacitor electrode, the capacitor so electrode is preferably not produced by outdiffusion.

To prevent leakage currents between adjacent lower source/drain regions of the transistors, it is advantageous if bottoms of the insulation trenches are located lower than the lower source/drain regions. As a result, the lower source/drain region is defined on two sides by the insulation trenches and on the other two sides by the first indentation and the second indentation, respectively. The same is true for the channel region, which is consequently a floating body. Since the gate electrode at one flank of the second indentation is preferably disposed only in the region of the channel region, it is expedient if the word line trench is shallower than the insulation trenches.

To simplify the process, it is advantageous if only a single word line is disposed in each of the word line trenches.

The word line can protrude from the word line trench. This is advantageous, since parts of the word line disposed outside the word line trench can be created from metal, so that the word line has an increased electrical conductivity. Furthermore, such a word line can be structured together with gate electrodes of transistors on the periphery of the DRAM cell configuration, which simplifies the process. For creating such a word line, after the word line trenches have been created at least one conductive material, such as doped polysilicon, is deposited, then structured with the aid of a striplike mask, whose strips extend substantially parallel to the word line trenches and do not cover at least some parts of the word line trenches.

To prevent the substrate from being attacked in the structuring, it is advantageous if a protective layer, created for instance in the creation of the gate dielectric, and which acts as an etch stop, is disposed on the substrate.

To increase the electrical conductivity of the word line, before the conductive material is structured a material having a high electrical conductivity, such as a metal or a metal silicide, can be deposited on the conductive material and then structured together with the conductive material.

If the bit lines are created such that they extend above the word lines, then to avoid short circuits between the bit lines and the word lines, it is advantageous to encapsulate the word lines. To that end, an insulating material, such as silicon nitride, is deposited and back-etched, so that protective spacers are created at flanks of the protruding parts of the word line. The word line can also be covered from above with insulating material, in that before the conductive material of the word line is structured, the insulating material is deposited and structured together with the conductive material. Interstices between the word lines can be filled with an insulating layer in order to create a planar surface. To create contact holes for the bit lines, the insulating layer is etched selectively to the insulating material with the aid of a mask that does not cover regions above the upper source/drain regions. Since the word lines are encapsulated by the insulating material, the DRAM cell configuration can be created with a high packing density. Any slight malalignment of the mask does not cause a short circuit of the word lines by the bit lines. Contacts are created in the contact holes. The contacts and the bit lines are created by depositing conductive material and structuring it with the aid of a striplike mask, whose strips extend transversely to the word lines and at least partly do not cover the contacts.

To avoid topology problems in the production process that an overly high aspect ratio would cause, that is, a ratio of level to width of a feature, it is advantageous for the word lines not to protrude from the word line trenches. For instance, the word lines are created, after the creation of the word line trenches, by depositing conductive material such as doped polysilicon to fill the word line trenches, and then back-etching it until the conductive material outside the word line trenches is removed.

It is within the scope of the invention if the first indentations are disposed such that memory nodes, which adjoin the word line trench, of adjacent memory cells alternatingly adjoin a first flank and a second flank of the word line trench. If a first word line adjoins the first flank of the word line trench and a second word line adjoins the second flank of the word line trench, then the DRAM cell configuration has folded bit lines. The first word line is connected to only every other one of these memory cells. The second word line is connected to the remaining ones of these memory cells, so that memory cells that are connected to adjacent bit lines are not connected to the same word line.

If the insulation trenches are created after the first indentations have been created, then a memory cell of the DRAM cell configuration can have a space requirement of 5 to 6 $F^2$.

It is within the scope of the invention if the first indentations are disposed such that memory nodes, which adjoin the word line trench, of adjacent memory cells adjoin the same flank of the word line trench. A spacing between adjacent word lines and a spacing between adjacent bit lines can be F, so that an effective space requirement per memory cell can amount to 4 $F^2$.

To reduce a capacitance between the word line and the substrate, it is advantageous to dispose an insulating structure which is thicker than the gate dielectric between the word line and the bottom of the word line trench.

It is within the scope of the invention if no word line trenches are provided for the word lines, so that the word lines have excrescences, which are disposed in the second indentations.

It is within the scope of the invention if the word line is disposed in the second indentation of the first memory cell and in the second indentation of the second memory cell.

The substrate is preferably a semiconductor substrate which includes monocrystalline silicon and/or germanium. The substrate can contain GaAs. The substrate can include epitaxially grown layers of semiconductor material.

Other features which are considered as characteristic for the invention are set forth in the appended claims.

Although the invention is illustrated and described herein as embodied in a dram cell configuration, and method for producing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 9B is a cross section, perpendicular to the cross section of FIG. 9A, through the fifth substrate.

FIG. 9C is a plan view on the fifth substrate, showing the insulators, the first indentations, the word line trenches, the bit lines, and regions that are not covered by a mask.

FIG. 18B shows the cross section of FIG. 17B, after the process steps of FIG. 18A have been performed.

The figures are not to scale.

In all the exemplary embodiments, F=150 nm; F is the minimum feature size feasible in the technology that is employed in the fabrication process.

DESCRIPTION OF THE PREFERRED EMBODIMENTS

Figure 1:
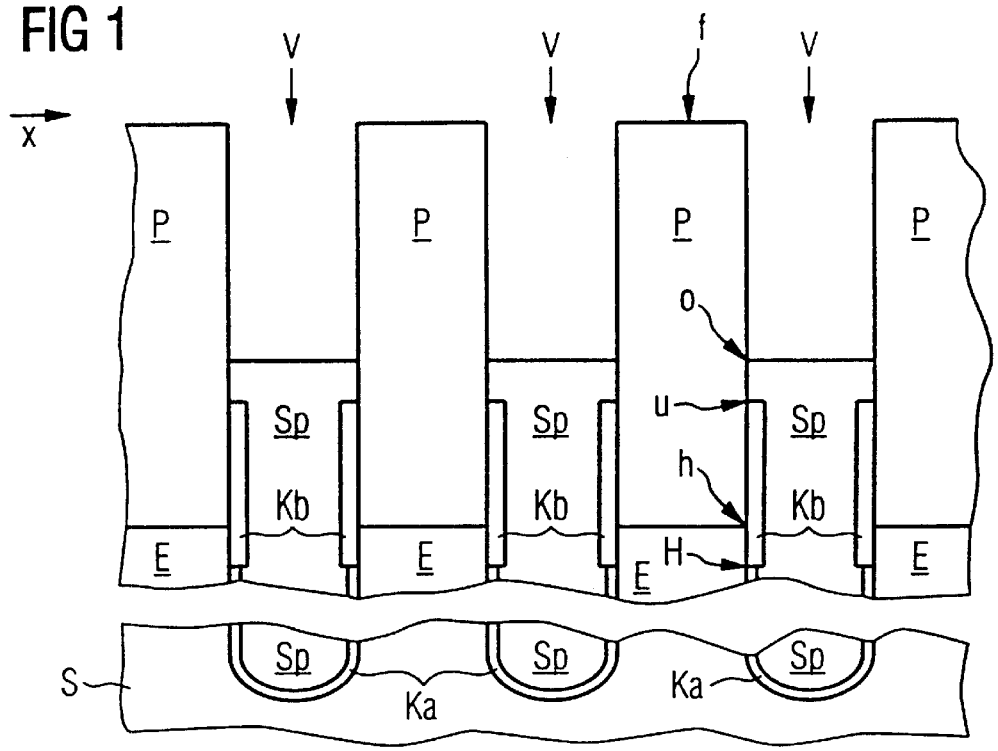
FIG. 1 shows a cross section through a first substrate, after indentations, a capacitor electrode, a first part of a capacitor dielectric, a second part of a capacitor dielectric, and memory nodes have been created.

Referring now to the figures of the drawing in detail and first, particularly, to FIG. 1 thereof, there is seen a first exemplary embodiment in which a first substrate S of silicon—for the most part n-doped—is provided which includes a p-doped layer P, approximately 1 $\mu$m thick, which has a dopant concentration of approximately $10^{18}$ cm$^{-3}$.

With the aid of a non-illustrated first mask of photoresist, indentations V approximately 10 $\mu$m deep are formed in the first substrate S. As the etchant, HBr+HF is for instance suitable. Each of the indentations V has two opposed flat flanks. The indentations V also have two further flanks opposite one another, which are curved, so that the indentations V have no edges or corners.

Figure 2A:
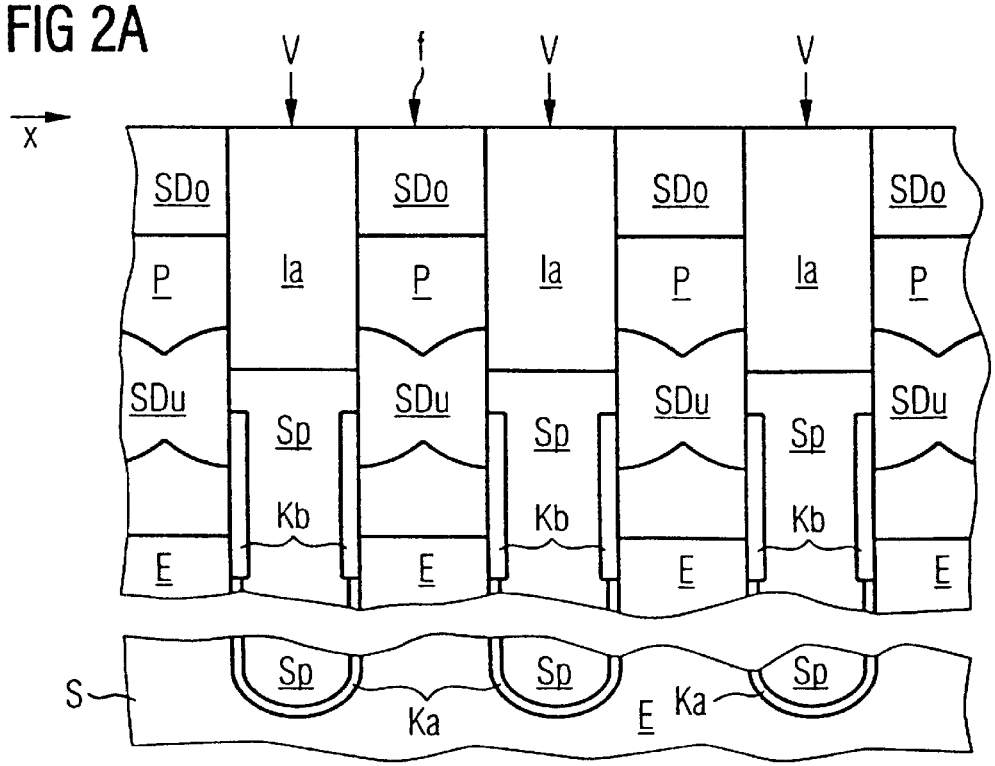
FIG. 2A shows a cross section from FIG. 1, after first insulating structures, insulation trenches, insulators, upper source/drain regions, and lower source/drain regions of transistors have been created.
Figure 2B:
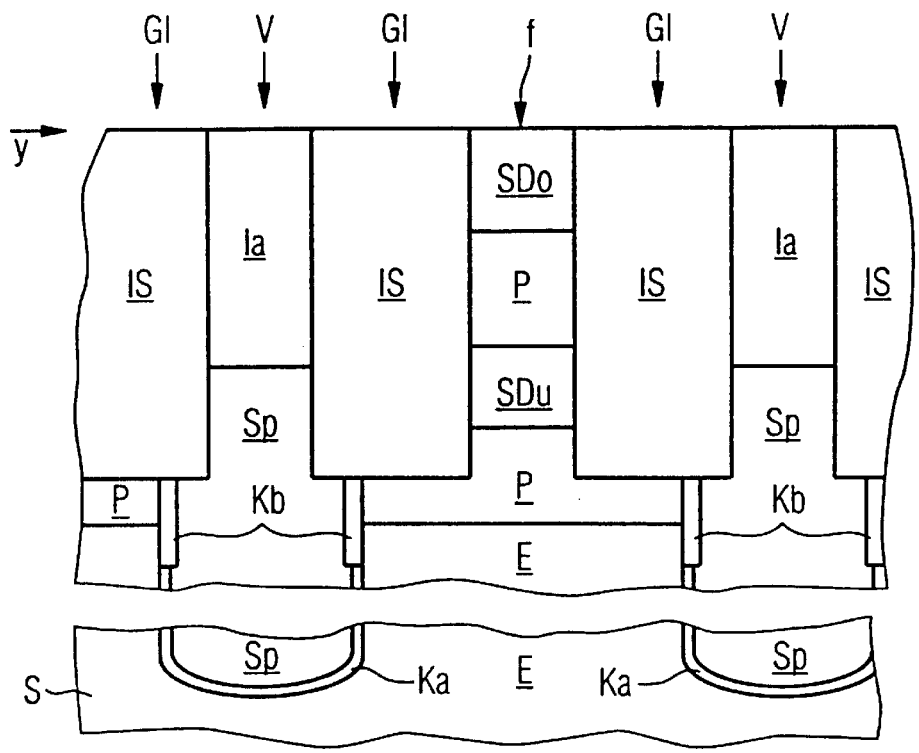
FIG. 2B shows a cross section through the first substrate that is perpendicular to the cross section of FIG. 2A.
Figure 2C:
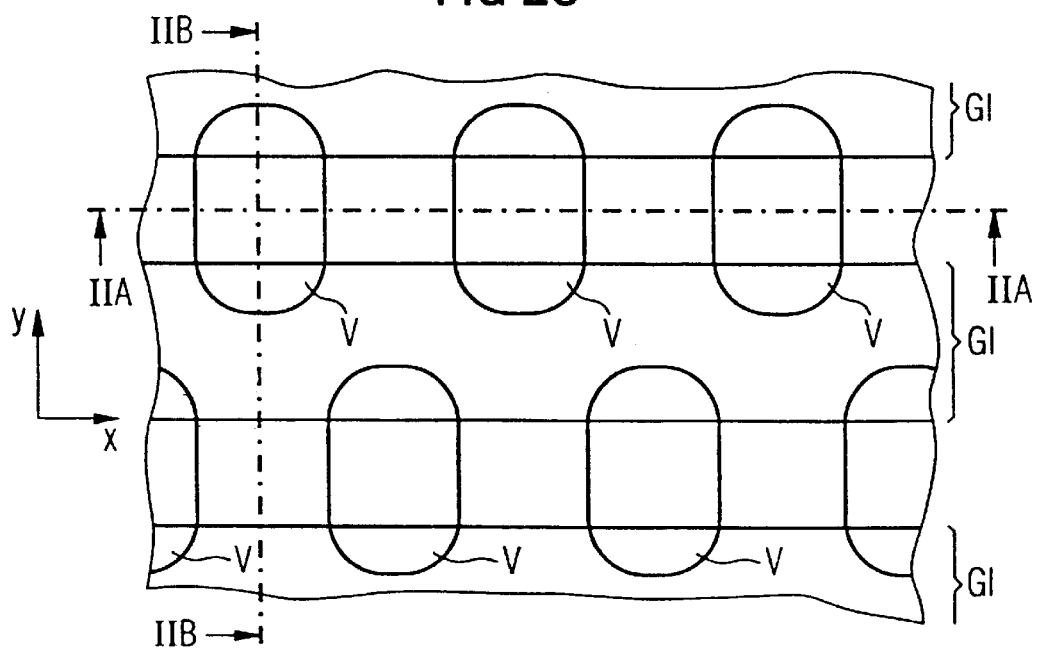
FIG. 2C shows a plan view on the first substrate, showing the indentations and the insulation trenches.

A y axis y extends parallel to a surface f of the first substrate S and parallel to the flat flanks of the indentations V. An x axis x extends perpendicular to the y axis y and parallel to the surface f of the first substrate S. A spacing between the two flat flanks of one of the indentations V amounts to approximately 190 nm. Rows are each formed by indentations V that are adjacent one another along the x axis x. A spacing between two indentations V of one row that are adjacent to one another amounts to approximately 185 nm. The projections of every other row on the x axis x match one another. Projections of adjacent rows on the x axis x are shifted translationally-symmetrically in the direction of the x axis x relative to one another, so that an indentation V of a first one of the rows is disposed between two adjacent indentations V of a second row adjacent to the first row. A spacing between the curved flanks of the indentation V with regard to the y axis y amounts to approximately 300 nm. A spacing, parallel to the y axis y, between an indentation V of one row and an indentation V of the second row from it is approximately 450 nm (see FIG. 2C).

The first mask of photoresist is then removed. Next, arsenic glass is deposited to a thickness of approximately 50 nm, so that faces of the indentations V are covered with arsenic glass, without the indentations V being filled (not shown). Next, photoresist is deposited to a thickness of approximately 500 nm and back-etched to a first level h (see FIG. 1) that is located approximately 1.5 $\mu$m below the surface f of the first substrate S. Oxygen $O_2$ plasma, for instance, is suitable as the etchant. Next, exposed parts of arsenic glass are removed, for instance with HF. The photoresist is removed, for instance with $O_2$ plasma. By means of a tempering step, dopant diffuses out of the arsenic glass into the first substrate S, so that in the first substrate S an n-doped capacitor electrode E is created which surrounds parts of the indentations V, extends into the p-doped layer P, and has a dopant concentration of approximately $10^{18}$ cm$^{-3}$ (see FIG. 1). Next, the arsenic glass is removed, for instance with hydrofluoric acid HF.

To create a first part Ka of a capacitor dielectric, a thermal oxidation is first performed, and subsequently silicon nitride is deposited and partly oxidized, so that the first part Ka of the capacitor dielectric is created in the form of an ONO layer approximately 4 nm thick (see FIG. 1).

Next, in situ n-doped polysilicon is deposited to a thickness of approximately 500 nm, so that the indentations V are filled. By chemical-mechanical polishing, the polysilicon is planarized, until the surface f of the first substrate S is exposed. Next, the polysilicon is etched back (see FIG. 1) to a second level H, which is below the first level h and approximately 2 $\mu$m below the surface f of the first substrate S. As the etchant, $C_2F_6+O_2$ is for instance suitable.

To create a second part Kb of the capacitor dielectric, by means of a TEOS process, $SiO_2$ is deposited to a thickness of approximately 25 nm and back-etched, for instance with $CHF_3+O_2$, so that spacerlike features are created at the flanks of the indentations V.

Next, in situ n-doped polysilicon is deposited to a thickness of approximately 500 nm, planarized by chemical-mechanical polishing until the surface f of the first substrate S is exposed, and back-etched to an upper level o, which is located above the first level h and approximately 400 nm below the surface f of the first substrate S. Next, the spacerlike features of $SiO_2$ are removed, for instance using HF, to a lower level u that is approximately 80 nm below the upper level o. The part of the spacerlike structure removed between the lower level u and the upper level o is replaced by amorphous n-doped silicon, in that the amorphous silicon is deposited to a thickness of approximately 20 nm and then isotropically etched to a depth of 30 nm (see FIG. 1). Remaining portions of the spacerlike features form the second part Kb of the capacitor dielectric. The capacitor dielectric Ka, Kb has recesses in a region between the lower level u and the upper level o. The polysilicon and the amorphous silicon form memory nodes Sp, which are each disposed in one of the indentations V, and in which recesses adjoin the substrate S.

To create a first insulating structure Ia, in a TEOS process, $SiO_2$ is deposited to a thickness of approximately 200 nm and back-etched, for instance with $CHF_3+O_2$, until the surface f of the first substrate S is exposed. The insulating structures Ia are disposed in the indentations V and on the memory nodes Sp (see FIGS. 2A and 2B).

With the aid of a striplike second mask of photoresist (not shown), whose strips are approximately 150 nm wide, have a spacing of approximately 225 nm from one another, and extend parallel to the x axis x, insulation trenches GI are created such that each of the indentations V are intersected by two of the insulation trenches GI, which are adjacent to one another. In the process, both the substrate S and the first insulating structures Ia, the memory nodes Sp, and the second part Kb of the capacitor dielectric are all etched. The insulation trenches GI are approximately 800 nm deep. $NF_3$+Ar (see FIGS. 2B and 2C) is for instance suitable as the etchant. The second mask is removed.

Next, in the insulation trenches GI, insulators IS are created, in that $Sio_2$ is deposited to a thickness of approximately 200 nm and planarized by chemical-mechanical polishing, until the surface f of the first substrate S is exposed.

By implantation with n-doped ions, adjoining the surface f of the exposed parts of the first substrate S, upper source/drain regions SDo of transistors are created. By a tempering step, implanted dopant is activated. The upper source/drain regions SDo are approximately 100 nm deep and have a dopant concentration of approximately $5 \times 10^{20}$ cm$^{-3}$. By means of the tempering step, dopant diffuses out of the memory nodes Sp in the region of the recesses into the first substrate S, creating source/drain regions SDu of the transistors that are each disposed between two of the indentations V and between two of the insulation trenches GI.

Figure 3A:
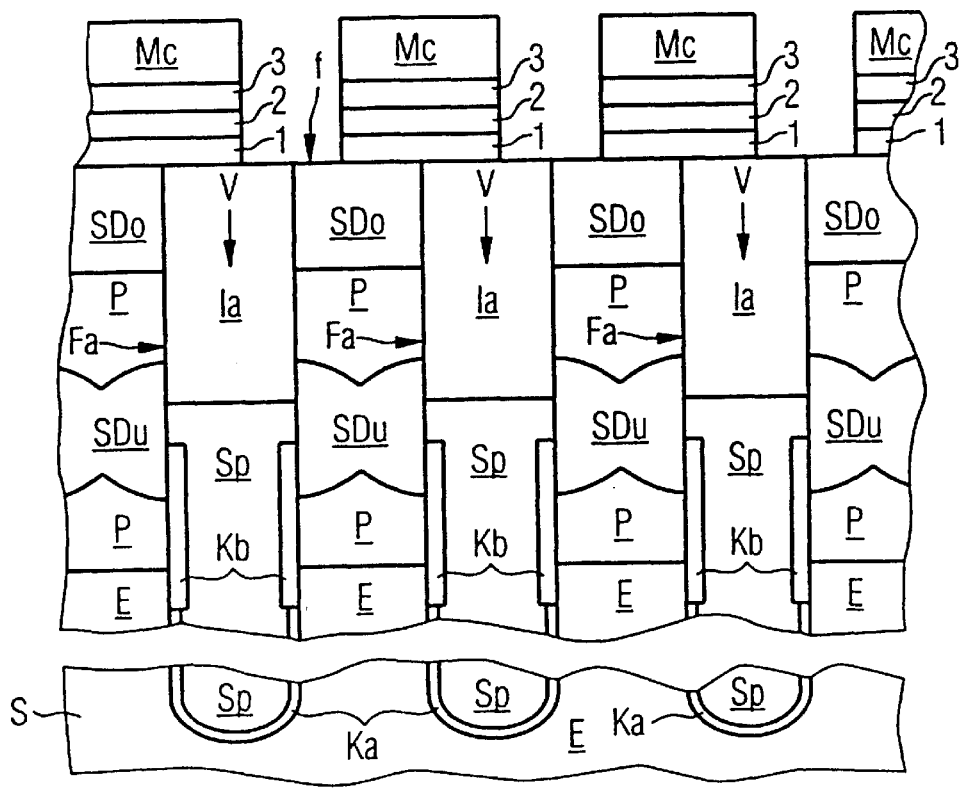
FIG. 3A shows the cross section of FIG. 2A, after a first layer, a second layer, and a mask of photoresist have been created and structured.
Figure 3B:
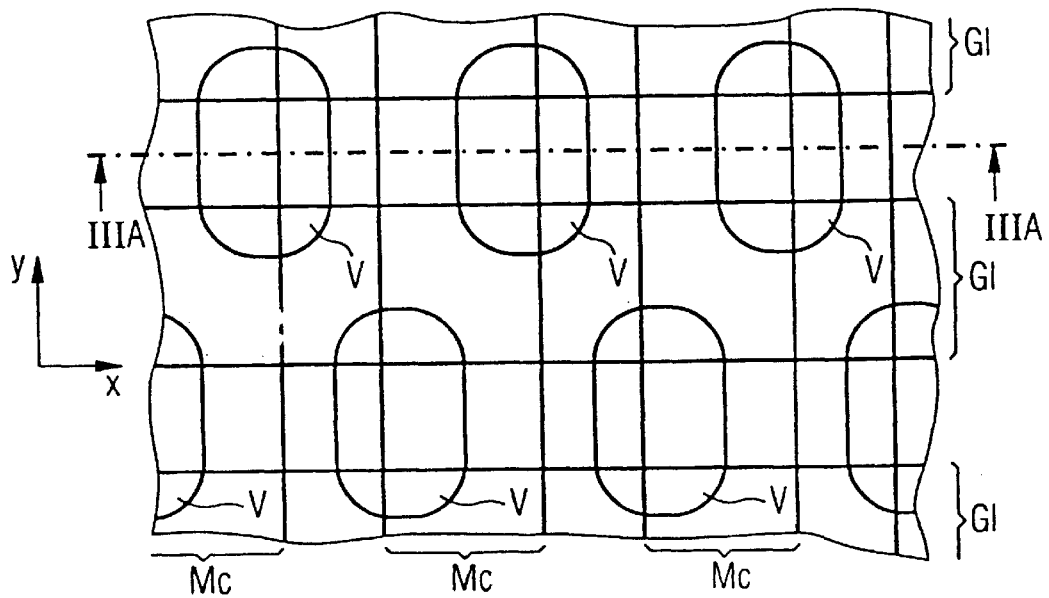
FIG. 3B shows the plan view of FIG. 2C, in which the indentations, the insulation trenches, and the mask of photoresist are shown.

To create a first layer 1, SiO$_2$ is deposited to a thickness of approximately 30 nm on the surface f of the first substrate S. Over that, to create a second layer 2, polysilicon is deposited to a thickness of approximately 30 nm. Above the second layer 2, a striplike third mask Mc of photoresist is created, whose strips are approximately 225 nm wide, have a spacing of approximately 150 nm from one another, and extend parallel to the y axis y (see FIG. 3B). In a plan view on the first substrate S, the strips of the third mask Mc overlap the upper source/drain regions SDo and the first insulating structures Ia (see FIG. 3A). Parts of the upper source/drain regions SDo and of the first insulating structures Ia, which are disposed in the region of first flanks Fa of the indentations V, are protected by the third mask Mc.

With the aid of the third mask Mc, first the second layer 2, the first layer 1, and then the first substrate S, the first insulating structures Ia, and the second parts Kb of the capacitor dielectric are etched, and the memory nodes Sp and the insulators IS are structured, so that between the strips of the third mask Mc, word line trenches GW are created, whose bottoms are located approximately 800 nm below the surface f of the first substrate S (see FIG. 4). NF$_3$+Ar is suitable as the etchant. The word line trenches GW adjoin the memory nodes Sp in the region of second flanks Fb of the indentations V, which flanks are opposite the first flanks Fa of the indentations V. The bottoms of the word line trenches GW are located deeper than the recesses of the capacitor dielectric Ka, Kb and higher than bottoms of the insulation trenches GI. The third mask Mc is removed.

Figure 4:
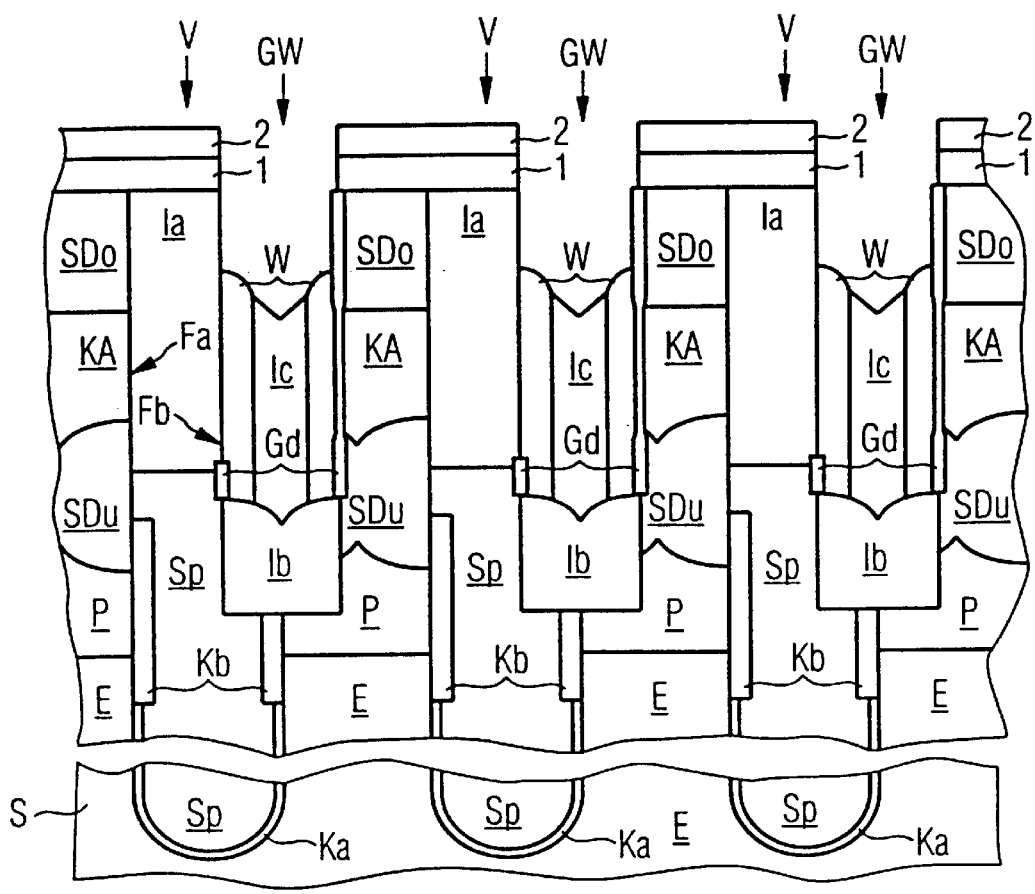
FIG. 4 shows the cross section of FIG. 3A, after word line trenches, second insulating structures, a gate dielectric, word lines, and third insulating structures have been created.

To create second insulating structures Ib, which cover the bottoms of the word line trenches GW, SiO$_2$ is deposited to a thickness of approximately 200 nm and is etched back to a depth of approximately 500 nm with CHF$_3$+O$_2$ (see FIG. 4).

By thermal oxidation, a gate dielectric Gd approximately 4 nm thick is created, which also covers the second layer 2.

To create word lines W, in situ n-doped polysilicon is deposited to a thickness of approximately 50 nm and back-etched, for instance with C$_2$F$_6$+O$_2$, until the word lines W in the form of spacers are created, which are disposed approximately 70 nm below the surface f of the first substrate S. In the back-etching, the gate dielectric Gd protects the second layer 2. First word lines of the word lines W adjoin first flanks of the word line trenches GW, and second word lines of the word lines W adjoin second flanks of the word line trenches GW. The word lines W are separated from the memory nodes Sp by the gate dielectric Gd, among other elements, and by the second insulating structures Ib.

The memory node Sp of the capacitor of a first memory cell, in the region of the capacitor dielectric Ka, Kb that is located at the first flank Fa of the associated indentation V, adjoins the lower source/drain region SDu of the transistor of the first memory cell. The lower source/drain region SDu is defined by two of the insulation trenches GI, by the indentation V, and by one of the word line trenches GW. The word line trench GW divides the lower source/drain region SDu from the indentation V of a second memory cell that is adjacent to the first memory cell. A portion of the first substrate S, which is located between the lower source/drain region SDu and the upper source/drain region SDo of the transistor, serves as a channel region KA of the transistor (see FIG. 4). A portion of one of the word lines W, which is disposed in the word line trench GW and is separated by the gate dielectric Gd from the channel region KA of the transistor, acts as a gate electrode of the transistor. Memory nodes Sp that adjoin the word line trench GW and belong to adjacent memory cells alternatingly adjoin a first flank and a second flank of the word line trench GW. The capacitor dielectric Ka, Kb now has only the recess that is located at the first flank Fa of the associated indentation V, since the other recesses have the insulation trenches IG and the word line trenches GW superimposed on them.

For creating third insulating structures Ic, SiO$_2$ is deposited to a thickness of approximately 200 nm and back-etched approximately 200 nm deep (see FIG. 4). The third insulating structures Ic are disposed in the word line trenches GW between the word lines W. In the back-etching of the SiO$_2$, the first layer 2 protects the first layer 1 and the insulators IS.

Figure 5A:
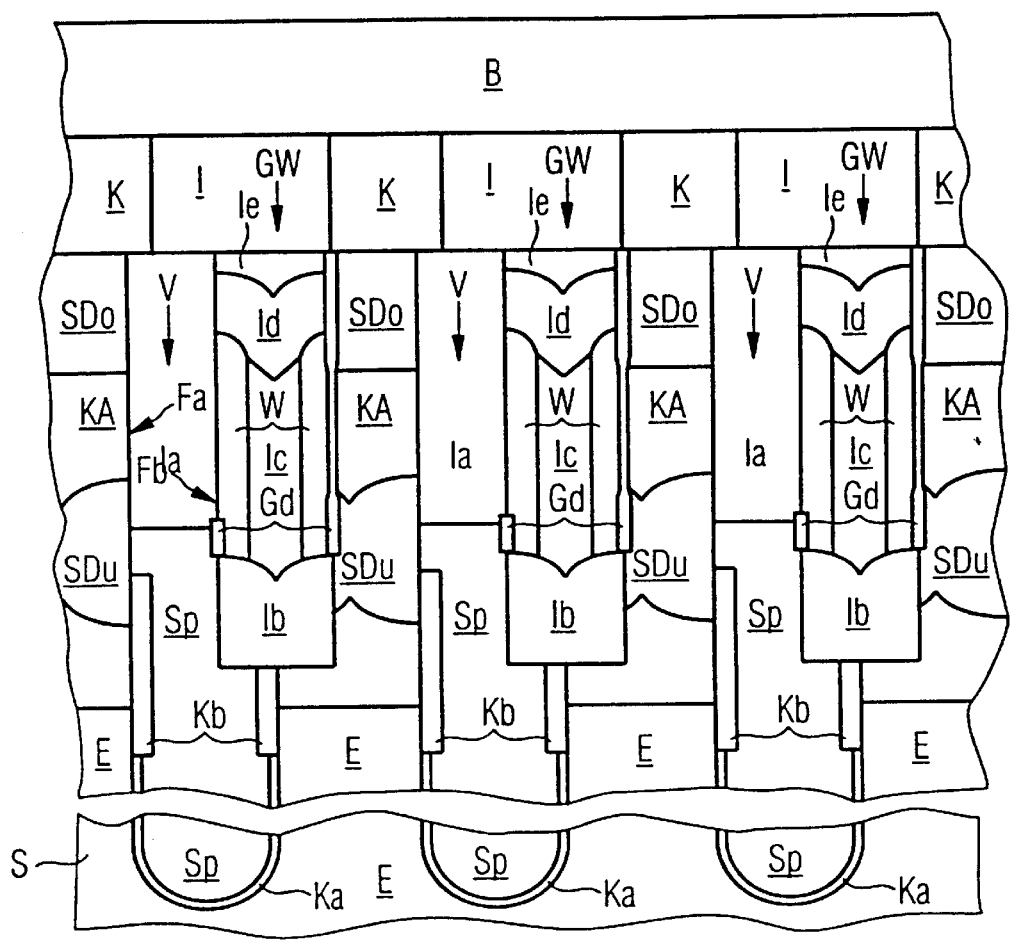
FIG. 5A shows the cross section of FIG. 4, after fourth insulating structures, fifth insulating structures, an insulating layer, contacts, and bit lines have been created.

For creating fourth insulating structures Id, silicon nitride is deposited to a thickness of approximately 100 nm and back-etched approximately 120 nm deep, for instance with C$_2$F$_6$+O$_2$, to 20 nm below the surface f. The fourth insulating structures Id are disposed in the word line trenches GW and cover the word lines W (see FIG. 5A).

For creating fifth insulating structures Ie, SiO$_2$ is deposited to a thickness of approximately 200 nm and planarized by chemical-mechanical polishing, until the surface f of the first substrate S is exposed. This creates a planar surface. The second layer 2 and the first layer 1 are removed in the process. The planar surface can also be formed by the fourth insulating structures Id, by polishing them chemically-mechanically instead of back-etching them. In that case, the fifth insulating structures Ie can be omitted.

For creating an insulating layer I, SiO$_2$ is deposited to a thickness of approximately 250 nm.

Figure 5B:
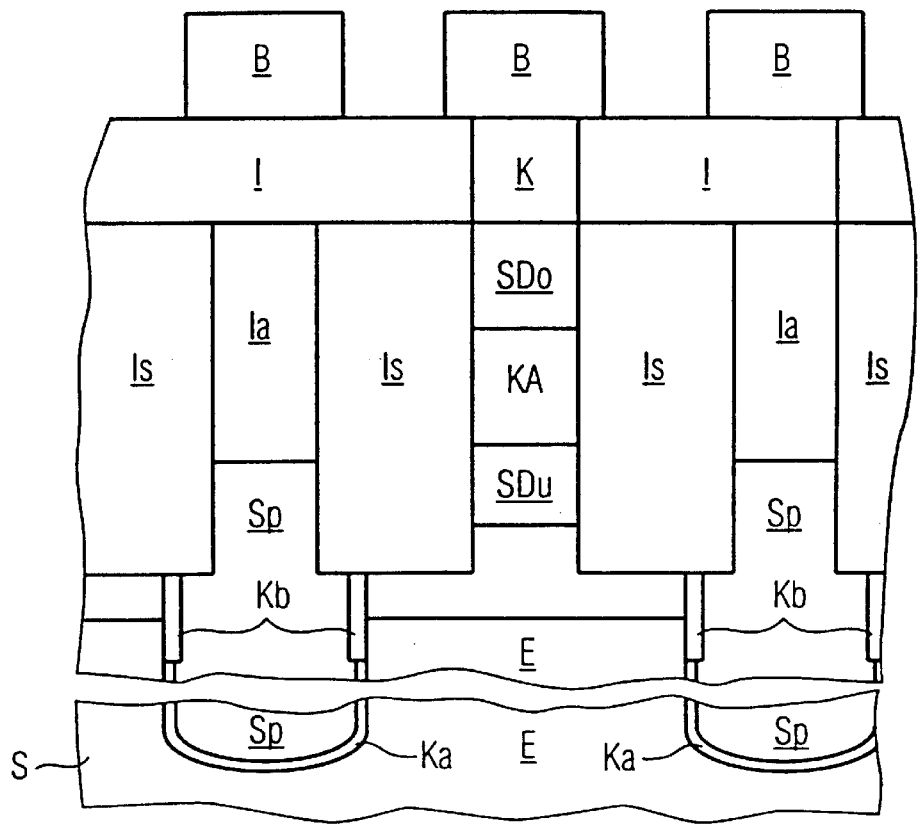
FIG. 5B shows the cross section of FIG. 2B after the process steps of FIG. 5A have been performed.
Figure 5C:
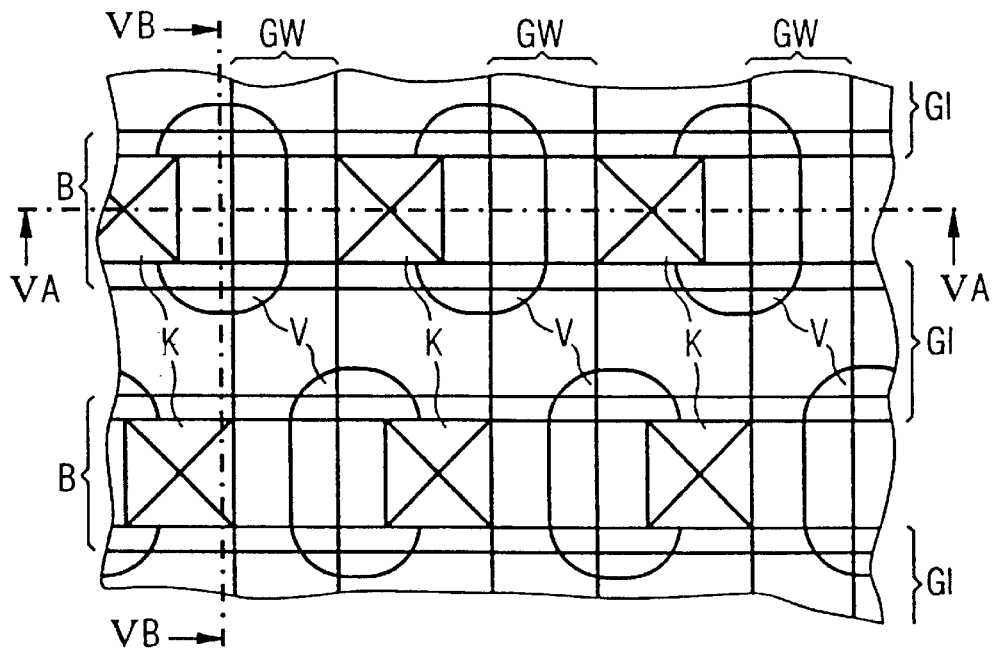
FIG. 5c shows the plan view of FIG. 3B, in which the indentations, the insulation trenches, the word line trenches, the contacts, and the bit lines are shown.

With the aid of a fourth mask of photoresist, which does not cover square regions Q with a length on a side of approximately 150 nm that overlap the upper source/drain regions SDo, contact holes are etched into the insulating layer I (see FIG. 5C). By deposition of tungsten to a thickness of approximately 100 nm and by chemical-mechanical polishing until the insulating layer I is exposed, contacts K are created in the contact holes.

Next, aluminum is deposited to a thickness of approximately 200 nm and structured with the aid of a striplike fifth mask of photoresist (not shown), whose strips are approximately 225 nm wide, have a spacing of approximately 150 nm from one another, and extend parallel to the x axis x. This creates bit lines B, which contact the upper source/drain regions SDo (see FIGS. 5A, 5B and 5C).

No two memory cells that are connected to adjacent bit lines B are connected to the same word line W. A DRAM cell configuration that includes the memory cells consequently has folded bit lines. The space requirement per memory cell is approximately 6.25 F$^2$, where F=150 nm is the minimum feature size feasible in the technology employed.

To read out an item of information from a memory cell, the associated word line is triggered, and the signal, which is defined by the charge of the associated capacitor, is read out via the associated bit line. To filter out background noise, this signal is compared with a signal at a bit line B adjacent to the bit line B.

For storing an item of information in a memory cell, the associated word line W is triggered, and a voltage is applied to the bit line B; depending on the information to be stored, this voltage amounts for instance to 0 V or 1.8 V.

In a second exemplary embodiment, a second substrate 1S is provided, which is equivalent to the substrate S of the first exemplary embodiment.

Figure 6:
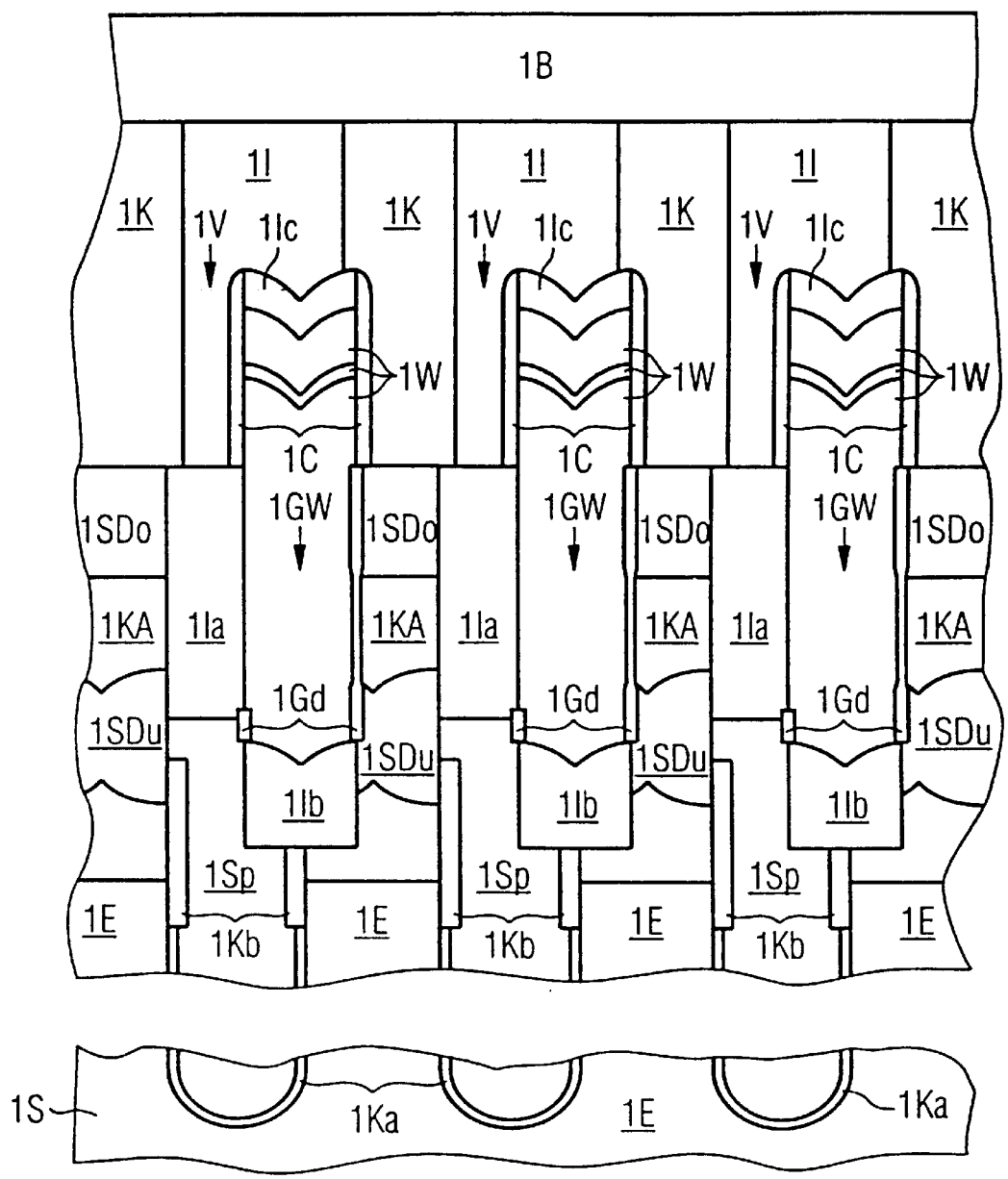
FIG. 6 shows a cross section through a second substrate, after indentations, a capacitor electrode, a capacitor dielectric, memory nodes, first insulating structures, insulation trenches with non-illustrated insulators, word line trenches, second insulating structures, a gate dielectric, upper source/drain regions, channel regions, lower source/drain regions, word lines, third insulating structures, spacers, an insulating layer, contacts, and bit lines have been created.

As in the first exemplary embodiment, indentations 1V, a capacitor electrode 1E, a capacitor dielectric 1K$a$, 1K$b$, memory nodes 1S$p$, first insulating structures 11$a$, insulators (not shown), upper source/drain regions 1SD$o$, channel regions 1KA, lower source/drain regions 1SD$u$, a non-illustrated first layer, a non-illustrated second layer, word line trenches 1GW, and second insulating structures 11$b$ are created (see FIG. 6). The second layer is removed. By thermal oxidation, a gate dielectric 1G$d$ is created.

Next, in situ n-doped polysilicon is deposited to a thickness of approximately 200 nm. Over that, tungsten nitride is deposited to a thickness of approximately 200 nm. Over that in turn, tungsten is deposited to a thickness of approximately 100 nm. Over that, silicon nitride is deposited to a thickness of approximately 100 nm. With the aid of a striplike photoresist mask (not shown), whose strips are disposed above the word line trenches 1GW, silicon nitride, tungsten, tungsten nitride, and polysilicon are etched, until the first insulating structures 11$a$ at a surface 1$f$ of the second substrate 1S are exposed (see FIG. 6). As a result, in each word line trench 1GW, a word line 1W is created that protrudes out of the word line trench 1GW and that comprises polysilicon, tungsten nitride, and tungsten. From the silicon nitride, third insulating structures 1I$c$ are created, which cover the word lines 1W. When the word lines 1GW are created, the first layer protects the upper source/drain regions 1SD$o$.

To encapsulate the word lines 1W, silicon nitride is deposited to a thickness of approximately 50 nm and back-etched, creating spacers 1C, which protrude from the substrate 1S, at flanks of parts of the word lines 1W (see FIG. 6).

Next, an insulating layer 1I, contacts 1K, and bit lines 1B are created. In the creation of contact holes for the contacts 1K, the third insulating structures 1I$c$ and the spacers 1C protect the word lines 1W.

A DRAM cell configuration created in this way has open bit lines.

In a third exemplary embodiment, a third substrate 2S is provided, which is equivalent to the first substrate S of the first exemplary embodiment.

Analogously to the first exemplary embodiment, indentations 2V, a capacitor electrode 2E, a capacitor dielectric 2K$a$, 2K$b$, memory nodes 2S$p$, first insulating structures 2I$a$, insulation trenches with insulators (not shown), upper source/drain regions 2SD$o$, channel regions 2KA, lower source/drain regions 2SD$u$, a first layer (not shown), a second layer (not shown), word line trenches 2GW, and second insulating structures 2I$b$ are created. The second layer is removed, and a gate dielectric 2G$d$ is created.

Next, in situ n-doped polysilicon is deposited to a thickness of approximately 100 nm and back-etched, for instance with $C_2F_6+O_2$, until in each word line trench 2GW, one word line 2W is created, which is located approximately 70 nm below a surface 2$f$ of the third substrate 2S (see FIG. 7).

Figure 7:
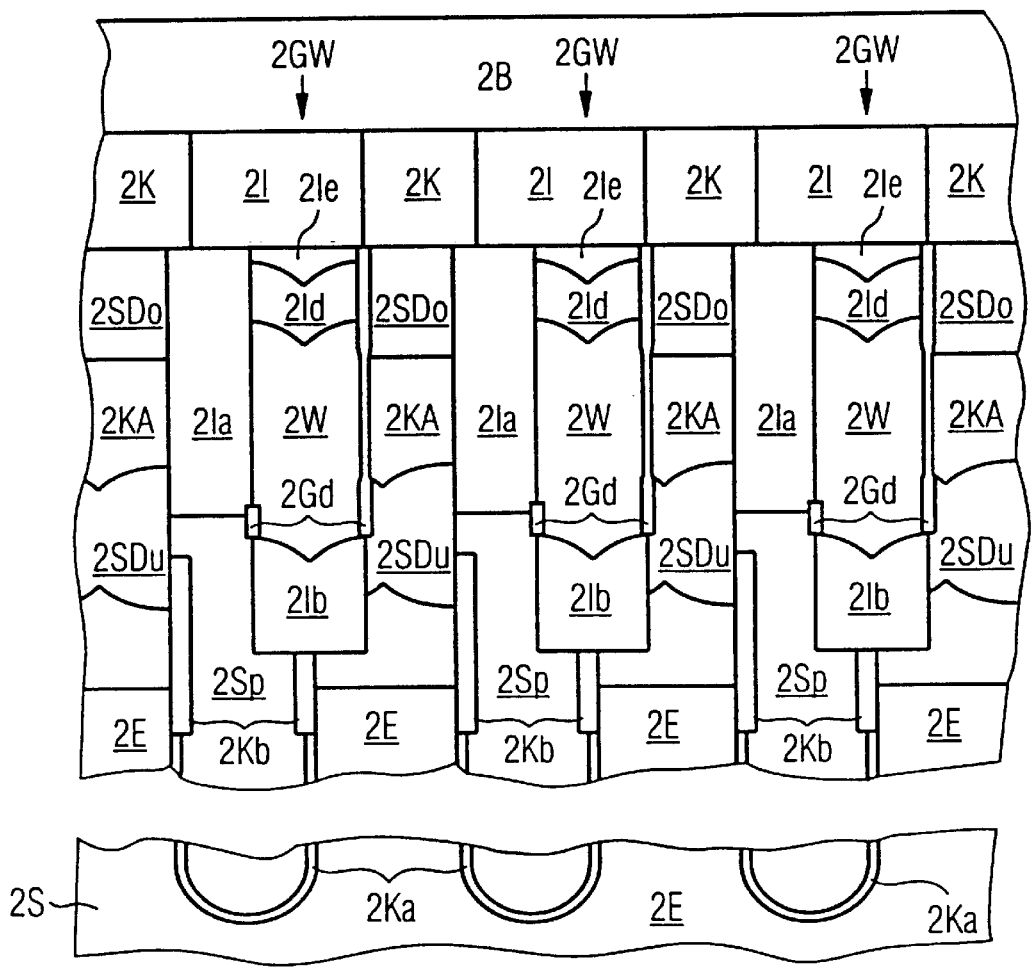
FIG. 7 shows a cross section through a third substrate, after indentations, a capacitor electrode, a capacitor dielectric, memory nodes, first insulating structures, insulation trenches with non-illustrated insulators, word line trenches, second insulating structures, a gate dielectric, upper source/drain regions, channel regions, lower source/drain regions, word lines, fourth insulating structures, fifth insulating structures, an insulating layer, contacts, and bit lines have been created.

Next, as in the first exemplary embodiment, fourth insulating structures 2I$d$ of silicon nitride, fifth insulating structures 2I$e$ of $SiO_2$, an insulating layer 2I, contacts 2K, and bit lines 2B are created (see FIG. 7).

A DRAM cell configuration created in this way has open bit lines.

In a fourth exemplary embodiment, a fourth substrate 3S is provided, which is equivalent to the first substrate S of the first exemplary embodiment.

Figure 8A:
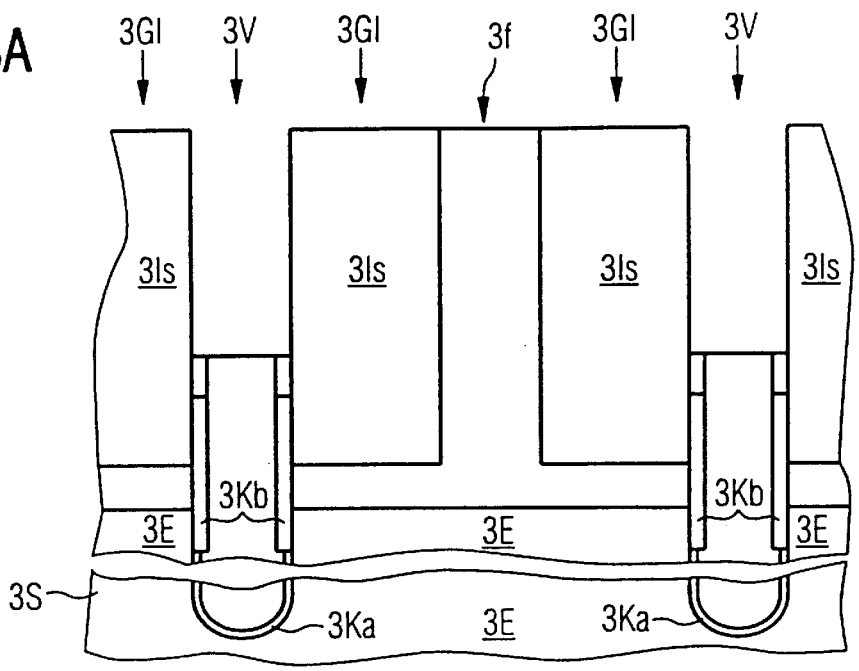
FIG. 8A shows a cross section through a fourth substrate, after insulation trenches with insulators, indentations, a capacitor electrode, and a capacitor dielectric have been created, and after conductive material has been deposited and back-etched.
Figure 8B:
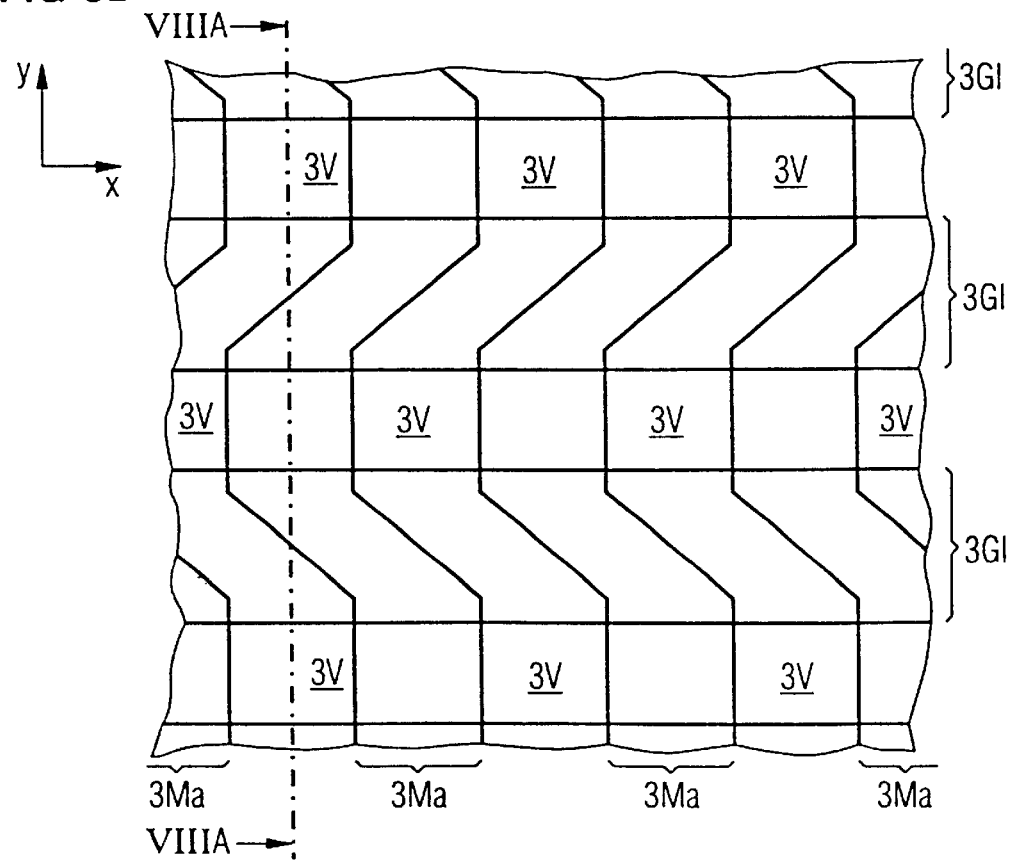
FIG. 8B is a plan view on the fourth substrate after the process steps of FIG. 8A have been performed.

With the aid of a striplike first mask of photoresist (not shown), whose strips are approximately 150 nm wide, have a spacing of approximately 225 nm from one another, and extend parallel to the x axis x, insulation trenches 3GI that are approximately 800 nm deep are created (see FIGS. 8A and 8B). $NF_3+Ar$, for instance, is suitable as the etchant.

Next, the first mask is removed. The insulation trenches 3GI are filled with insulators 3IS, by deposition of $SiO_2$ to a thickness of approximately 200 nm and planarizing by chemical-mechanical polishing, until a surface 3$f$ of the fourth substrate 3S is exposed (see FIG. 8A).

Next, a second mask 3M$a$ of photoresist is created. The second mask 3M$a$ has strips coiled in zigzag fashion (see FIG. 8B), so that in the etching of the third substrate 3S selectively to the insulators 3IS in the insulation trenches 3GI, rectangular indentations 3V are created, whose dimension parallel to the x axis x is approximately 180 nm and whose dimension parallel to the y axis y is approximately 150 nm (see FIGS. 8A and 8B). As in the first exemplary embodiment, indentations 3V adjacent to one another along the x axis x form rows, projections from which onto the x axis of every other row match one another. The projection of an indentation 3V of one row adjoins the projections of two indentations of an adjacent row. The indentations 3V are approximately 10 $\mu$m deep. HBr+HF, for example, is suitable as the etchant.

The second mask 3M$a$ is then removed.

To create a second part of a capacitor dielectric 3K$b$, silicon nitride is first deposited to a thickness of approximately 20 nm. Over that, photoresist is applied to a thickness of approximately 500 nm and etched back approximately 2 $\mu$m deep, for instance using $O_2$ plasma. Exposed parts of the silicon nitride are removed, for instance with $H_3PO_4$. Next, the photoresist is removed, so that flanks of the indentations 3V are exposed between a second level H, which is located approximately 2 $\mu$m below the surface 3$f$, and the surface 3$f$ itself, while below the second level H they are covered by silicon nitride. By a thermal oxidation, between the second level H and the surface 3$f$, the second part, approximately 25 nm thick, of the capacitor dielectric 3K$b$ is created. The oxidized silicon nitride is then removed.

A capacitor electrode 3E which surrounds the indixentations 3V is created by plasma immersion.

As in the first exemplary embodiment, a first part 3K$a$ of the capacitor dielectric and memory nodes 3S$p$ are created; portions of the second part 3K$b$ of the capacitor dielectric above a lower level u are removed (see FIG. 8A). As in the first exemplary embodiment, first insulating structures, upper source/drain regions, channel regions, lower source/drain regions, word line trenches, a gate dielectric, word lines, further insulating structures, an insulating layer, contacts, and bit lines are created (not shown).

In a fifth exemplary embodiment, a fifth substrate 4S is provided, which is equivalent to the first substrate S of the first exemplary embodiment. As in the fourth exemplary embodiment, insulation trenches 4GI are created, with the distinction that the insulation trenches 4GI are approximately 150 nm wide (see FIG. 9C).

As in the fourth exemplary embodiment, the insulation trenches 4GI are filled with insulators 4IS.

Next, a striplike mask 4M*a* of photoresist is created, whose strips are approximately 150 nm wide, have a spacing of approximately 150 nm from one another, and extend parallel to the y axis y (see FIG. 9C). With the aid of the mask 4M*a*, the fifth substrate 4S is etched selectively to the insulators 4IS, creating indentations 4V, between the insulation trenches 4GI, which have a square horizontal cross section with a length of approximately 150 nm on a side. Indentations 4V adjacent one another in the x axis x form one row. Adjacent rows are disposed such that memory cells adjacent one another along the y axis y form columns (see FIG. 9C).

As in the fourth exemplary embodiment, a capacitor electrode 4E, a capacitor dielectric 4K*a*, 4K*b*, and memory nodes 4S*p* are created.

Figure 9A:
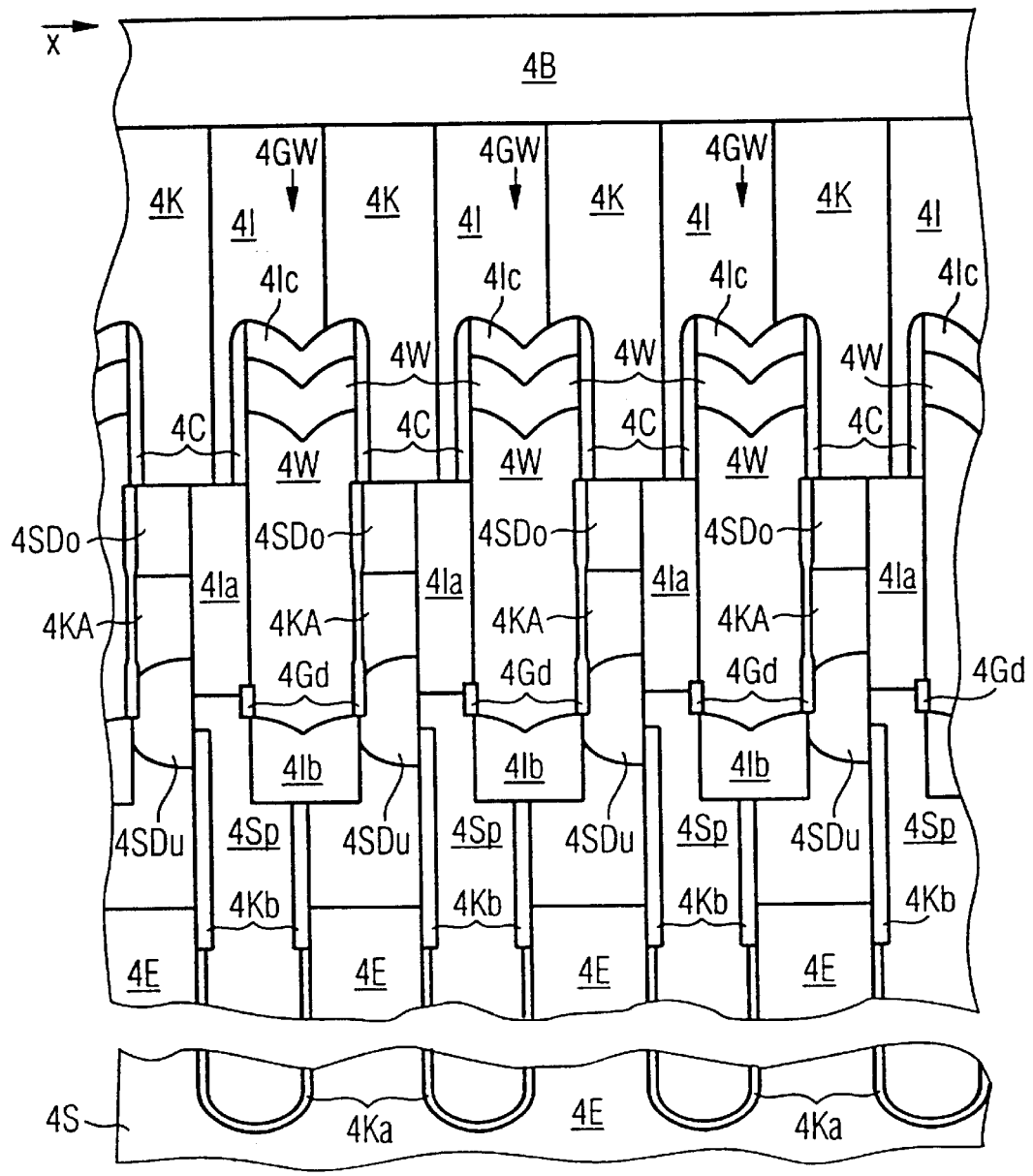
FIG. 9A shows a cross section through a fifth substrate, after insulation trenches with insulators (shown in FIG. 9B), indentations, a capacitor electrode, a capacitor dielectric, memory nodes, first insulating structures, word line trenches, second insulating structures, a gate dielectric, upper source/drain regions, channel regions, lower source/drain regions, word lines, third insulating structures, spacers, an insulating layer, contacts, and bit lines have been created.

Next, as in the second exemplary embodiment, insulating structures 4I*a*, 4I*b*, 4I*c*, word line trenches 4GW, a gate dielectric 4G*d*, word lines 4W, spacers 4C, an insulating layer 4I, contacts 4K, and bit lines 4B are created (see FIGS. 9A and 9B).

A DPA cell configuration created in this way has memory cells with a space requirement of only 4 F$^2$.

Figure 10A:
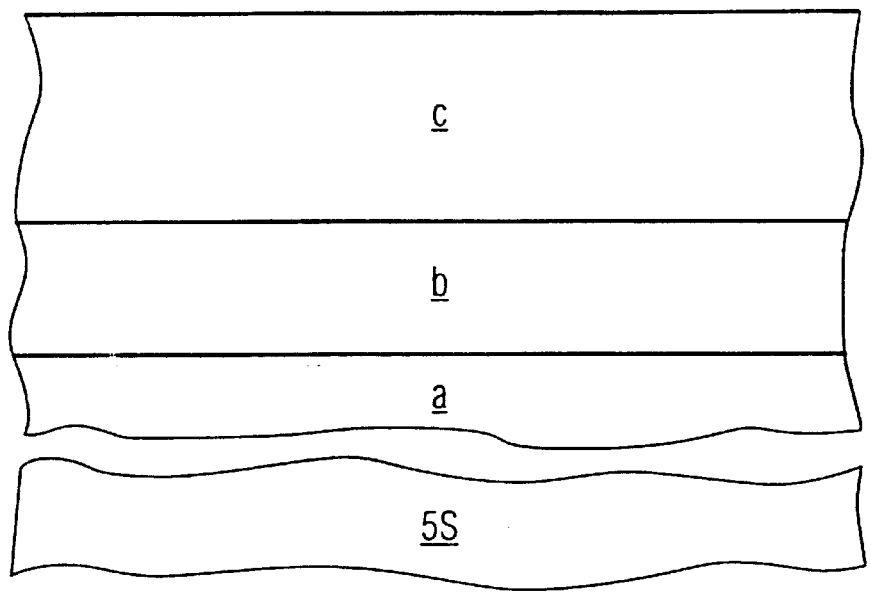
FIG. 10A is a cross section through a sixth substrate, after a first layer, a second layer, and a third layer have been created.

In a sixth exemplary embodiment, a sixth substrate 5S of monocrystalline n-doped silicon with a dopant concentration of approximately 10$^{15}$ cm$^{-3}$ is provided. By implantation with p-doped ions, a first layer a approximately 500 nm thick is created, which has a dopant concentration of approximately 10$^{18}$ cm$^{-3}$. By epitaxy, over the first layer a, an n-doped second layer b approximately 200 nm thick is created, which has a dopant concentration of approximately 5*10$^{18}$ cm$^{-3}$. Over the second layer b, by epitaxy, a p-doped third layer c approximately 300 nm thick is created, which has a dopant concentration of approximately 10$^{18}$ cm$^{-3}$ (see FIG. 10A).

Next, as in first exemplary embodiment, indentations 5V, a capacitor electrode 5E, a capacitor dielectric 5K*a*, 5K*b*, memory nodes 5S*p*, first insulating structures 5I*a*, insulation trenches with insulators (not shown), upper source/drain regions 5S/Do of transistors, and channel regions 5KA of the transistors are created. The upper source/drain regions 5S/Do are created in upper portions of the third layer c. Remaining portions of the third layer c form the channel regions SKA.

By a tempering step, dopant diffuses out of the memory nodes 5S*p* into the second layer b. The tempering step is performed with a shorter duration than the corresponding tempering step in the first exemplary embodiment, so that the dopants of different memory nodes 5S*p* do not meet one another (see FIG. 10*b*). At first flanks 5F*a* of the indentations 5V, highly doped parts 5S/Du of lower source/drain regions of the transistors are thereby created in the second layer b, and these parts have a dopant concentration of approximately 10$^{19}$ cm$^{-3}$. Remaining portions of the second layer b form low-doped portions of the lower source/drain regions.

Figure 10B:
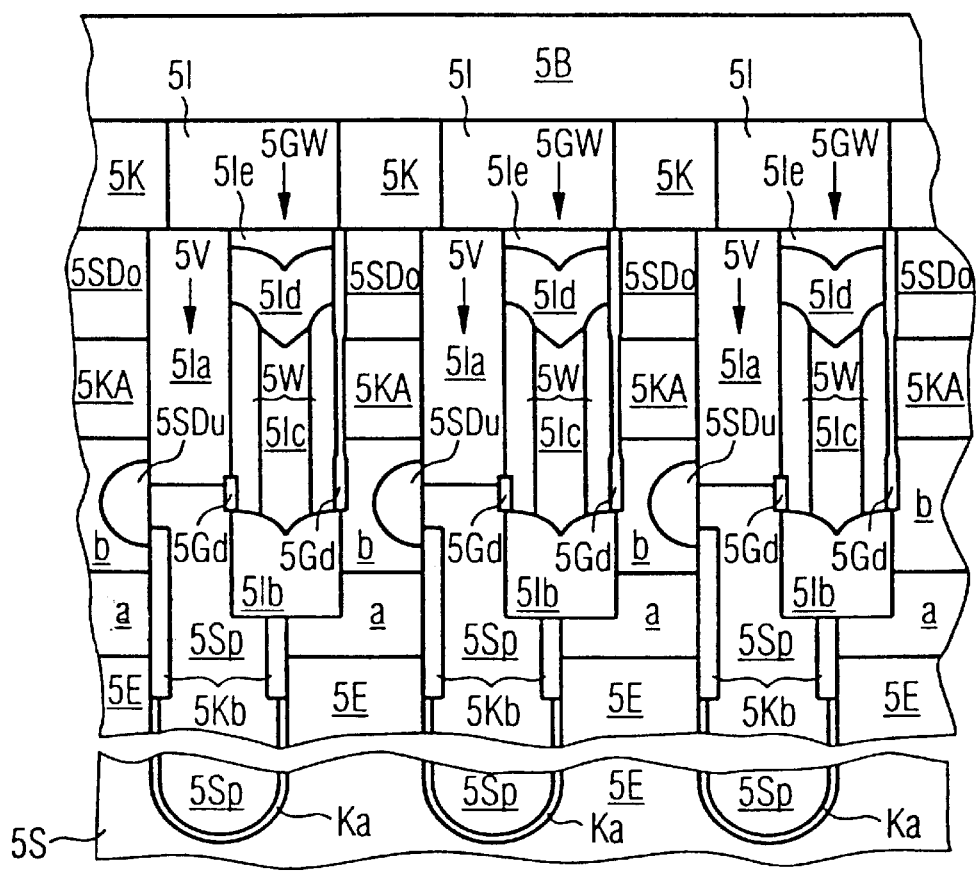
FIG. 10B shows the cross section of FIG. 10A, after indentations, a capacitor electrode, a capacitor dielectric, memory nodes, first insulating structures, insulation trenches (not shown), upper source/drain regions, channel regions, lower source/drain regions, word line trenches, second insulating structures, a gate dielectric, word lines, third insulating structures, fourth insulating structures, fifth insulating structures, an insulating layer, contacts, and bit lines have been created.

As in the first exemplary embodiment, word line trenches 5GW, second insulating structures 5I*b*, a gate dielectric 5G*d*, word lines SW, third insulating structures 5I*c*, fourth insulating structures 5I*d*, fifth insulating structures 5I*e*, an insulating layer 5I, contacts 5K, and bit lines 5B are created (see FIG. 10*b*).

A DRAM cell configuration created in this way has lesser leakage currents than the DRAM cell configuration of the first exemplary embodiment, since the highly doped portions 5SD*u* of the lower source/drain regions do not directly adjoin the channel regions 5KA or the first layer a. In contrast to the first exemplary embodiment, because of the low-doped portions of the lower source/drain regions, the DRAM cell configuration has softer p-n junctions.

A channel length of the transistors can be set more precisely than in the first exemplary embodiment, since it is determined by epitaxy and by the implantation depth of the upper source/drain regions 5S/Do. By comparison, the channel length in the first exemplary embodiment is determined by an etching depth, combined with out-diffusion and the implantation depth of the upper source/drain regions S/Do.

In a seventh exemplary embodiment, a seventh substrate 6S is provided, which is equivalent to the fifth substrate 4S of the fifth exemplary embodiment. As in the fifth exemplary embodiment, insulation trenches (not shown) are created and filled with insulators (not shown).

For creating a first layer N1 of silicon nitride, silicon nitride is deposited to a thickness of approximately 50 nm. As in the fifth exemplary embodiment, indentations 6V are created, and in addition the first layer N1 of silicon nitride is structured (see FIG. 11).

Next, silicon nitride is deposited to a thickness of approximately 4 nm. Over that, photoresist is applied to a thickness of approximately 500 nm and is back-etched approximately 2 $\mu$m deep using O$_2$ plasma.

By etching, for instance with H$_3$PO$_4$, silicon nitride is removed to a thickness of approximately 4 nm, so that the first layer N1 of silicon nitride is preserved, but silicon nitride of flanks of the indentations 6V that are located above the photoresist is exposed. The photoresist is then removed.

By thermal oxidation, between a level H, which is equivalent to the second level H of the first exemplary embodiment, and a surface 6*f* of the sixth substrate 6S, a second portion 6K*b* of a capacitor dielectric is created. The silicon nitride below the level H is oxidized and forms a first portion 6K*a* of the capacitor dielectric (see FIG. 11).

Figure 11:
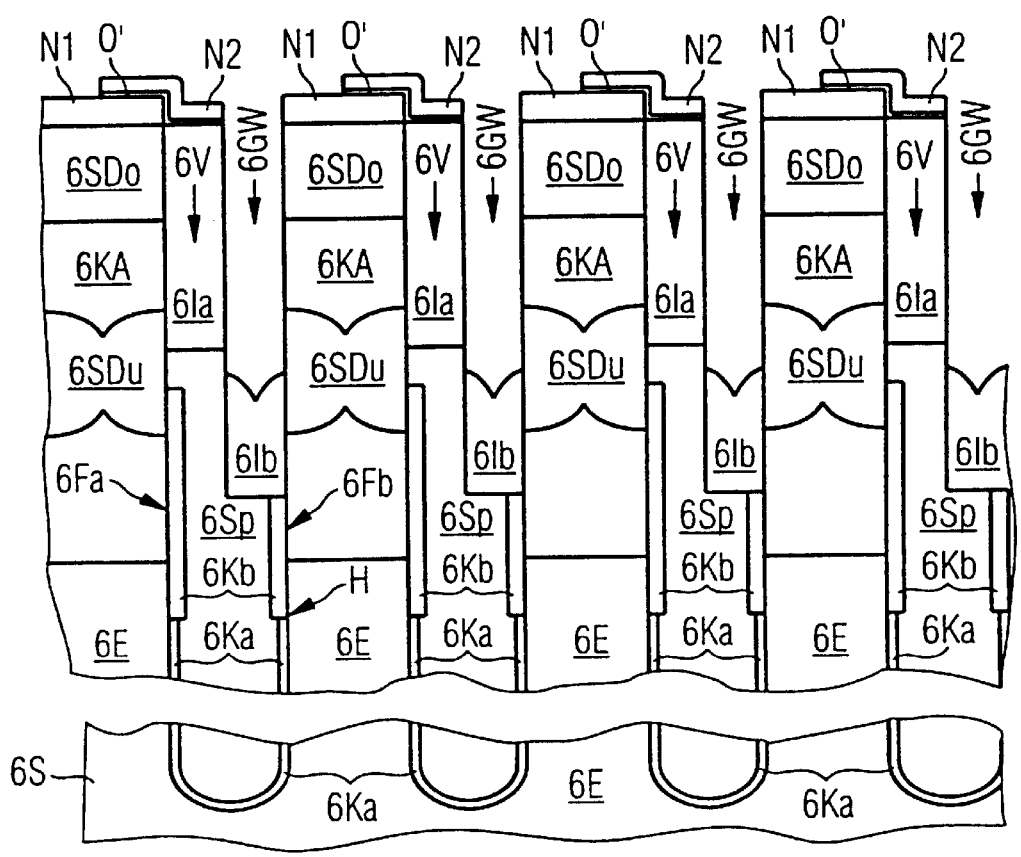
FIG. 11 shows a cross section through a seventh substrate, after insulation trenches with insulators (not shown), a first layer of silicon nitride, indentations, a capacitor dielectric, a capacitor electrode, memory nodes, first insulating structures, upper source/drain regions, channel regions, lower source/drain regions, a layer of $SiO_2$, a second layer of silicon nitride, word line trenches, and second insulating structures have been created.

As in the fifth exemplary embodiment, a capacitor electrode 6E, memory nodes 6S*p*, first insulating structures 6I*a*, upper source/drain regions 6SDo, channel regions 6KA, and lower source/drain regions 6SD*u* are created (see FIG. 11).

In a TEOS process, a layer O' of SiO$_2$ approximately 10 nm thick is created (see FIG. 11). Over it, a second layer N2 of silicon nitride approximately 3 nm thick is created.

With the aid of a striplike mask (not shown), which is equivalent to the third mask Mc of the first exemplary embodiment, the second layer N2 of silicon nitride is structured. The second layer N2 of silicon nitride covers regions above first flanks 6F*a* of the indentations 6V. The layer O' of Sio$_2$ acts as an etch stop. After that, the mask is removed.

By etching of SiO$_2$ and silicon, word line trenches 6GW are created. The layer O' is structured in the process. Because of the first layer N1 of silicon nitride and the second layer N2 of silicon nitride, which act as a mask, the word line trenches 6GW have a width of only approximately 75 nm. The word line trenches 6GW and the indentations 6V share portions of second flanks 6F*b*, opposite the first flanks 6F*a*, of the indentations 6V (see FIG. 11). The elongation of the seventh substrate 6S perpendicular to the channel plane is defined by the lithography and amounts to F=150 nm, where F is the minimum feature size feasible in the technology employed.

Figure 12:
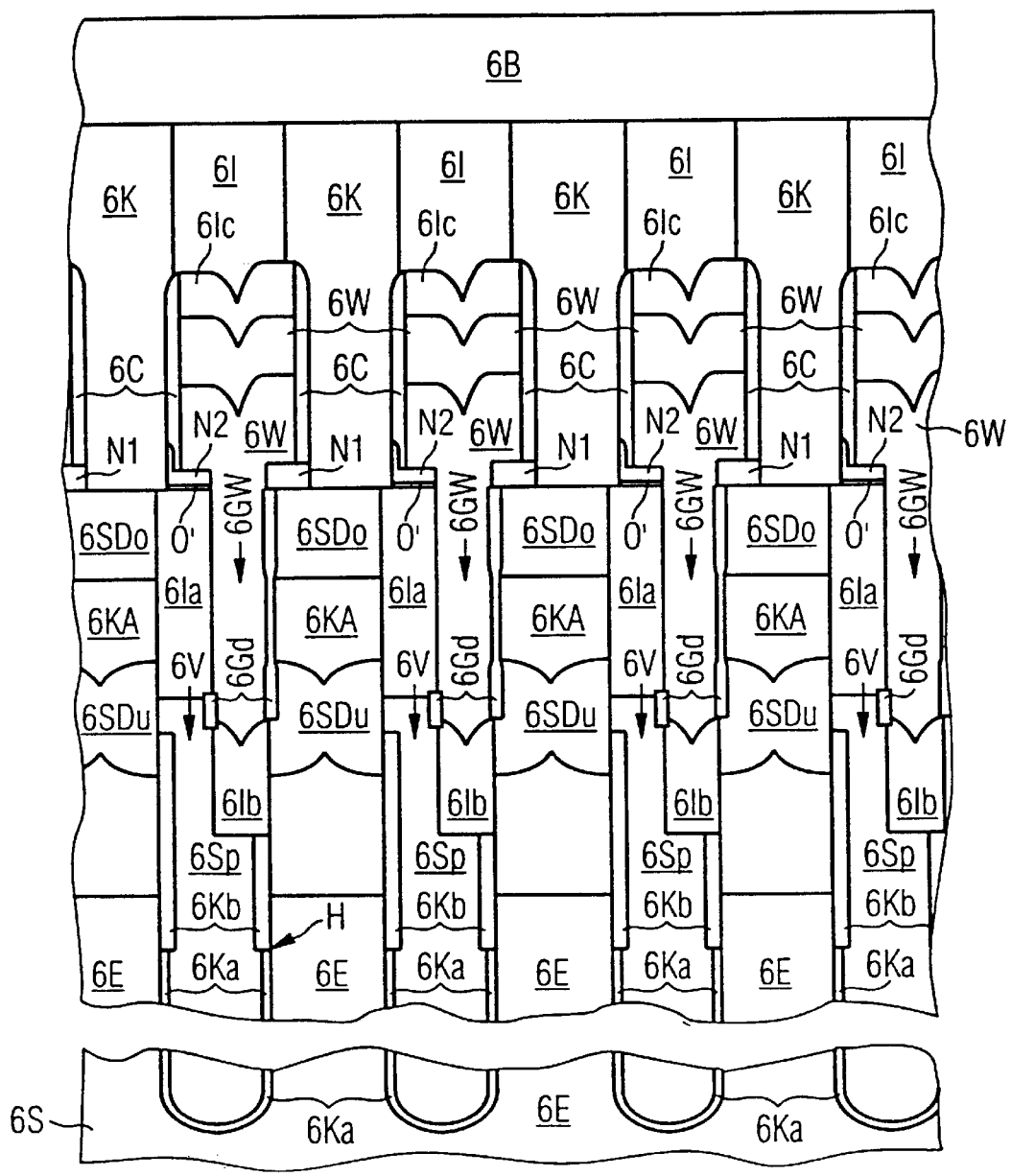
FIG. 12 shows the cross section of FIG. 11, after a gate dielectric, word lines, third insulating structures, spacers, an insulating layer, contacts, and bit lines have been created.

As in the fifth exemplary embodiment, second insulating structures 6I*b*, a gate dielectric 6G*d*, word lines 6W, and third insulating structures 6I*c* are created (see FIG. 12).

To create spacers 6C, which encapsulate the word lines 6W, silicon nitride is deposited to a thickness of approximately 50 nm and etched back by approximately 50 nm, for instance with $C_2F_6+O_2$. In the process, portions of the first layer N1 of silicon nitride and of the second layer N2 of silicon nitride are removed (see FIG. 12).

Next, as in the fifth exemplary embodiment, an insulating layer 6I, contacts 6K, and bit lines 6B are created (see FIG. 12).

In an eighth exemplary embodiment, an eighth substrate 7S is provided, which is equivalent to the seventh substrate 6S of the seventh exemplary embodiment.

Figure 13:
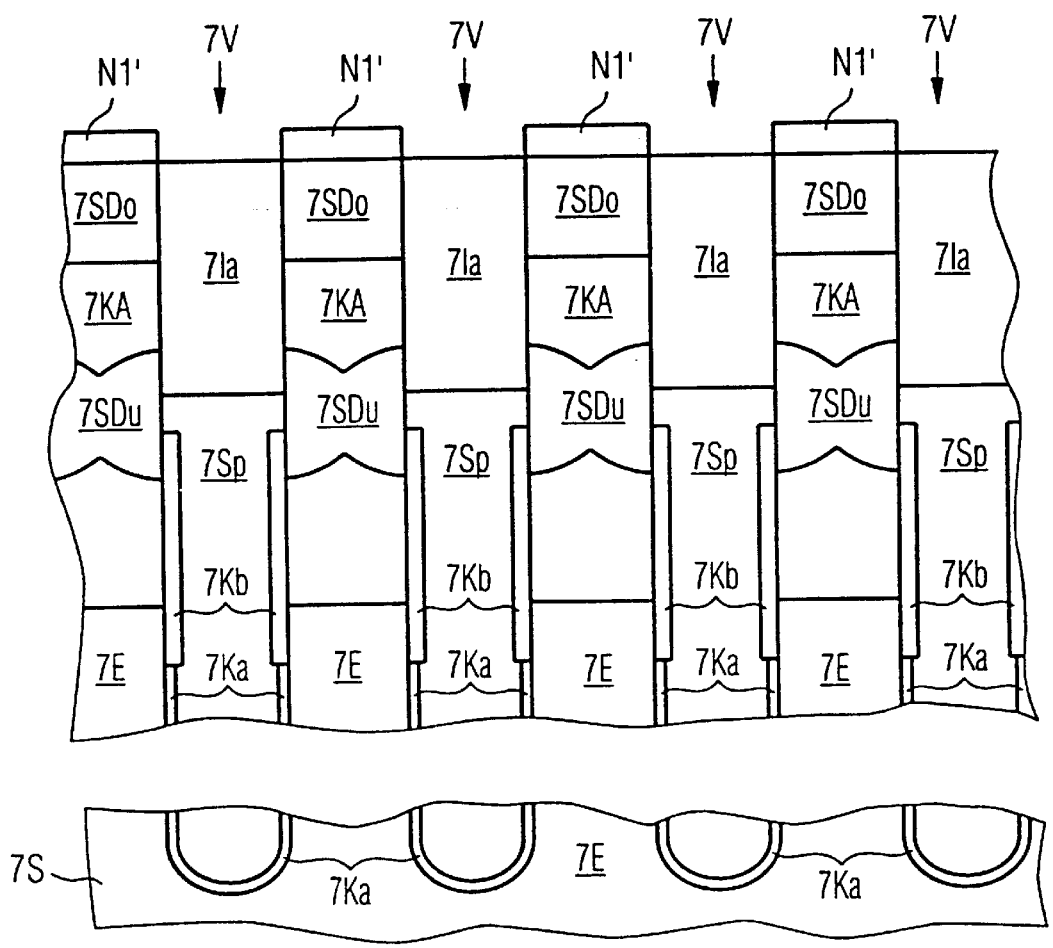
FIG. 13 shows the cross section through an eighth substrate, after a layer of silicon nitride, indentations, a capacitor electrode, a capacitor dielectric, memory nodes, first insulating structures, upper source/drain regions, channel regions, lower source/drain regions, and insulation trenches with insulators (not shown) have been created.

As in the seventh exemplary embodiment, a layer N1' of silicon nitride, indentations 7V, a capacitor electrode 7E, a capacitor dielectric 7K$a$, 7K$b$, memory nodes 7S$p$, first insulating structures 7I$a$, upper source/drain regions 7SD$o$, channel regions 7KA, lower source/drain regions 7SD$u$, and insulation trenches with insulators (not shown) are created (see FIG. 13).

With the aid of the layer N1' of silicon nitride, the first insulating structures 7I$a$ in indentations 7V are removed along with portions of the insulator (not shown), so that word line trenches 7GW, which intersect the indentations 7V, extend transversely to the insulation trenches (not shown). The word line trenches 7GW are narrowed by means of spacers 7C, in that silicon nitride is deposited to a thickness of approximately 50 nm and back-etched (see FIG. 14).

With the aid of a mask of photoresist, which is equivalent to the third mask Mc of the first exemplary embodiment, those spacers 7C that adjoin first flanks 7F$a$ of the indentations 7V (see FIG. 14) are removed. The word line trenches 7GW are consequently widened again and together with the indentations 7V share portions of second flanks 7F$b$, opposite the first flanks 7F$a$, of the indentations 7V.

By means of an anisotropic etching selectively to silicon nitride, for instance with $C_2F_6+O_2$, etching is done to a depth of approximately 400 nm, making the word line trenches 7GW deeper, so that they extend to approximately 800 nm below a surface 7$f$ of the eighth substrate 7S.

Figure 14:
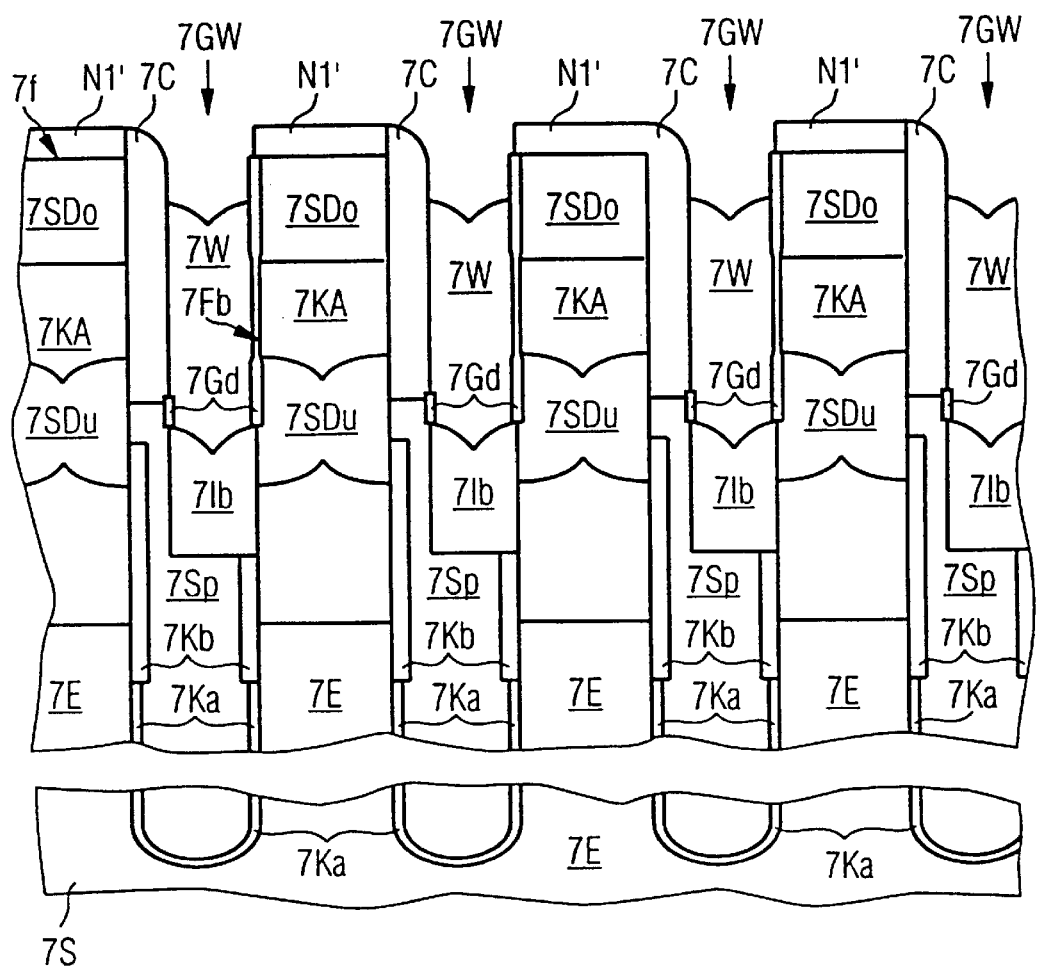
FIG. 14 shows the cross section of FIG. 13, after word line trenches, spacers, second insulating structures, a gate dielectric, and word lines have been created.

As in the third exemplary embodiment, second insulating structures 7I$b$, a gate dielectric 7G$d$, and word lines 7W are created (see FIG. 14).

After the creation of the word lines 7W, the spacers 7C and the layer N1' of silicon nitride are removed. By deposition of $SiO_2$ to a thickness of approximately 200 nm and by chemical-mechanical polishing until the surface 7$f$ is exposed, third insulating structures 7I$c$ are created, which adjoin the word lines 7W and cover them (see FIG. 14).

Figure 15:
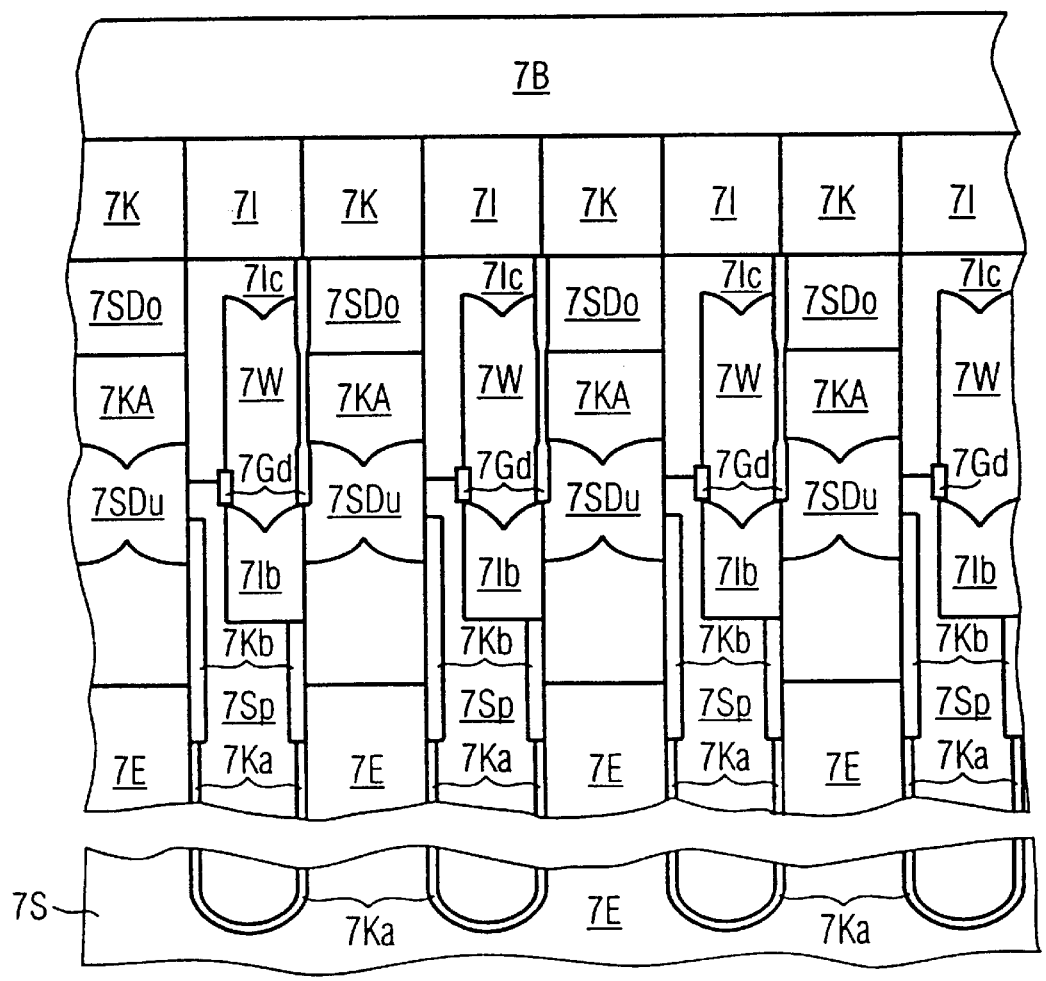
FIG. 15 shows the cross section of FIG. 14, after third insulating structures, an insulating layer, contacts, and bit lines have been created.

As in the seventh exemplary embodiment, an insulating layer 7I, contacts 7K, and bit lines 7B are created (see FIG. 15).

In a ninth exemplary embodiment, what is for the most part an n-doped ninth substrate 8S is provided; it includes a p-doped layer 8P, approximately 1.2 $\mu$m thick, with a dopant concentration of approximately $10^{18}$ cm$^{-3}$.

Over a surface 8$f$ of the ninth substrate 8S, $SiO_2$ is deposited to a thickness of approximately 300 nm. For creating a mask 8M of $SiO_2$, the $SiO_2$ is structured, for instance with $CHF_3+O_2$, using a first photoresist mask (not shown), until the surface 8$f$ is exposed. A plan view on the mask 8M is equivalent to a plan view on the indentations V of the first exemplary embodiment, with the distinction that a spacing between parts of the mask 8M that are adjacent one another along the x axis x is approximately 150 nm. A spacing, parallel to the y axis y, between a part of the mask 8M of one row and a part of the mask 8M of the second row from it is approximately 450 nm.

The first photoresist mask is then removed. To create first spacers 8C1, silicon nitride is deposited to a thickness of approximately 70 nm and etched back to approximately 100 nm deep. The first spacers 8C1 adjoin flanks of the mask 8M. Upper parts of the flanks of the mask 8M are exposed (see FIGS. 16A–16C).

Figure 16A:
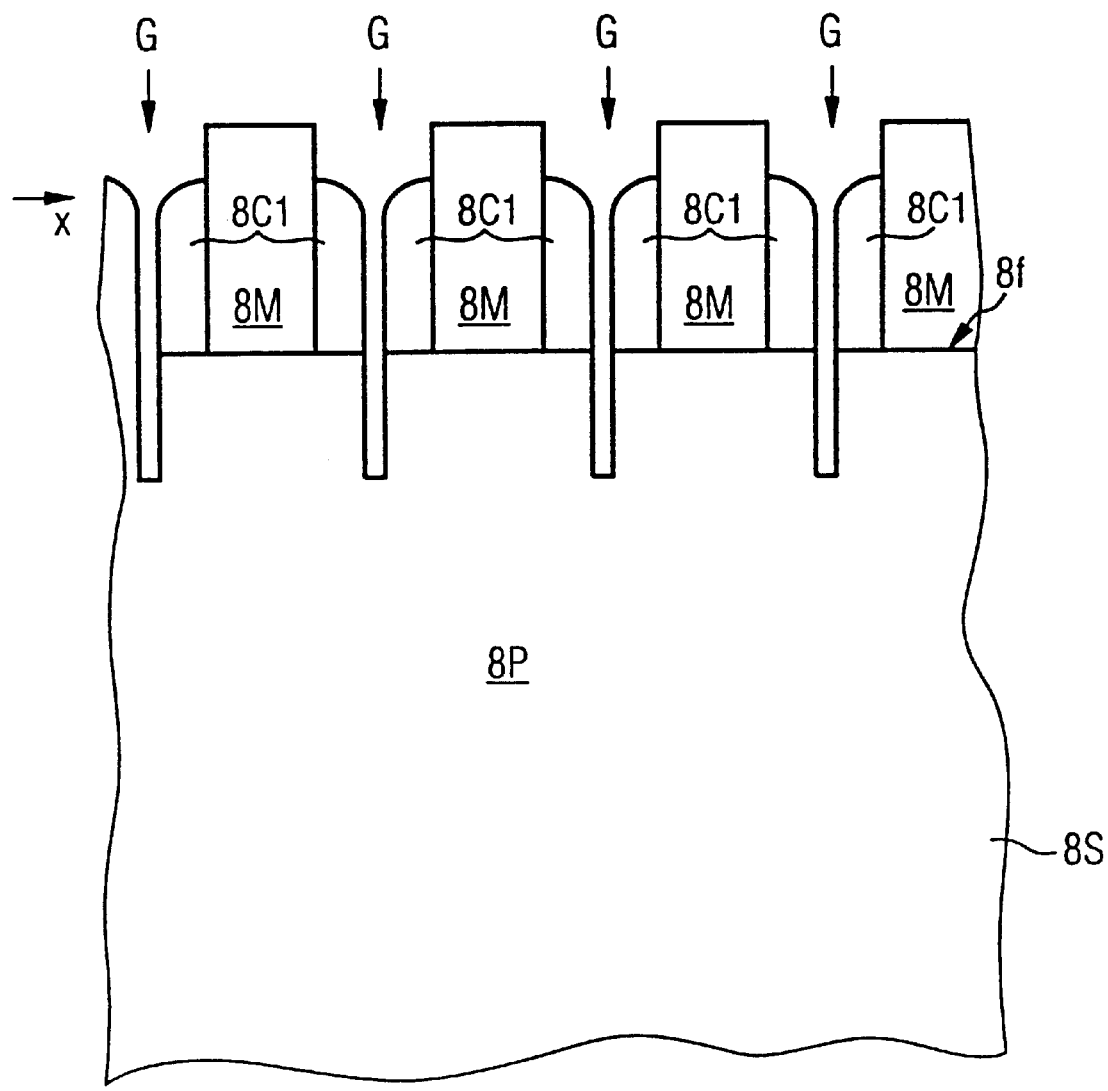
FIG. 16A shows the cross section through a ninth substrate, which includes a layer, after a mask, first spacers, and trenches have been created.
Figure 16B:
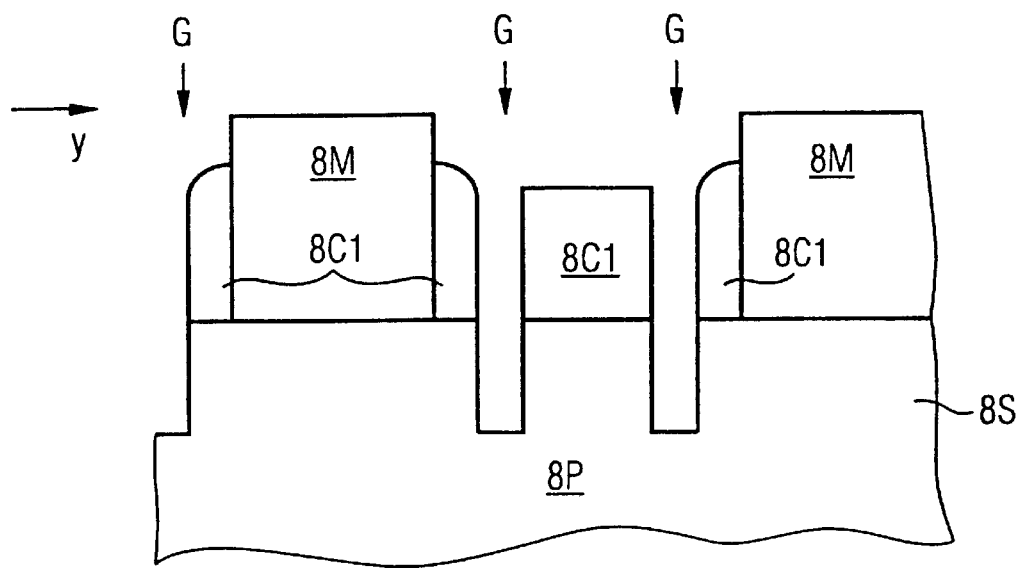
FIG. 16B shows a cross section, perpendicular to the cross section of FIG. 16A, through the ninth substrate after the process steps of FIG. 16A have been performed.
Figure 16C:
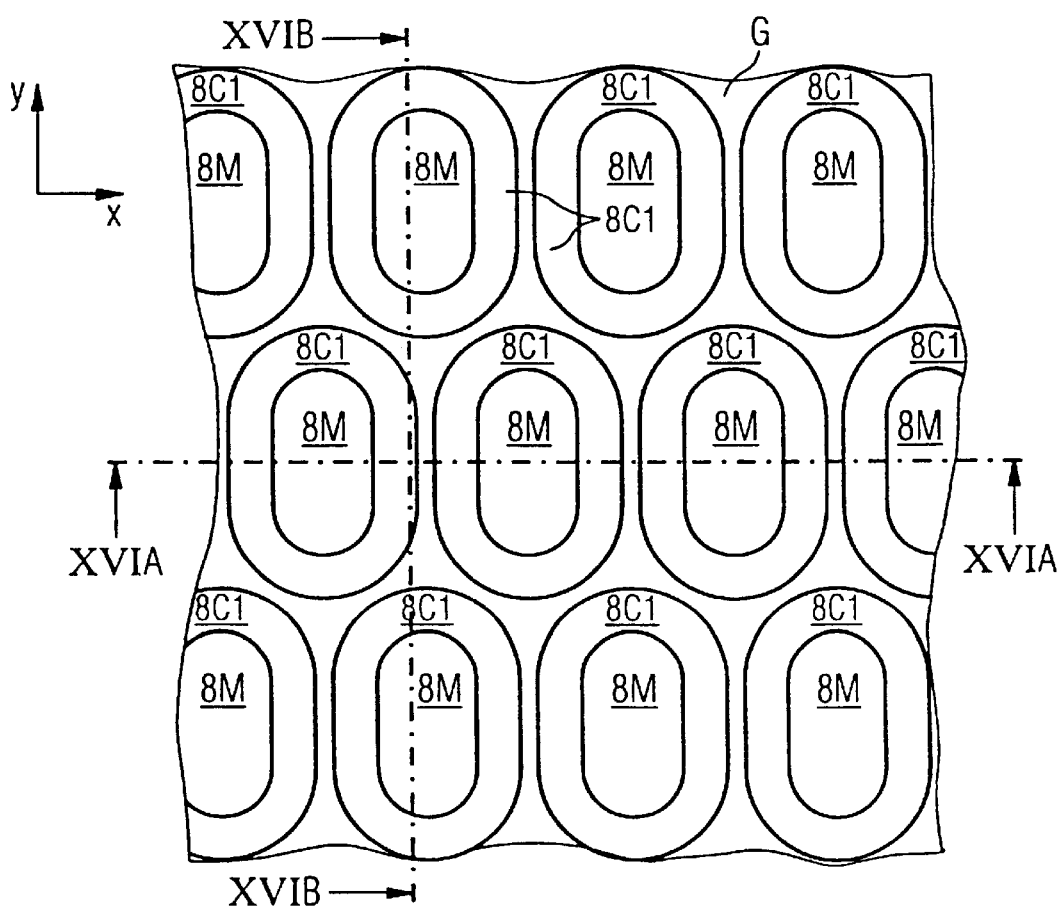
FIG. 16C is a plan view on the ninth substrate, showing the mask, the first spacers, and the trenches.

By etching of silicon selectively to silicon nitride and $SiO_2$, for instance using HBr+HF, trenches G approximately 100 nm thick are etched between the first spacers 8C1 (see FIGS. 16A–16C).

Figure 17A:
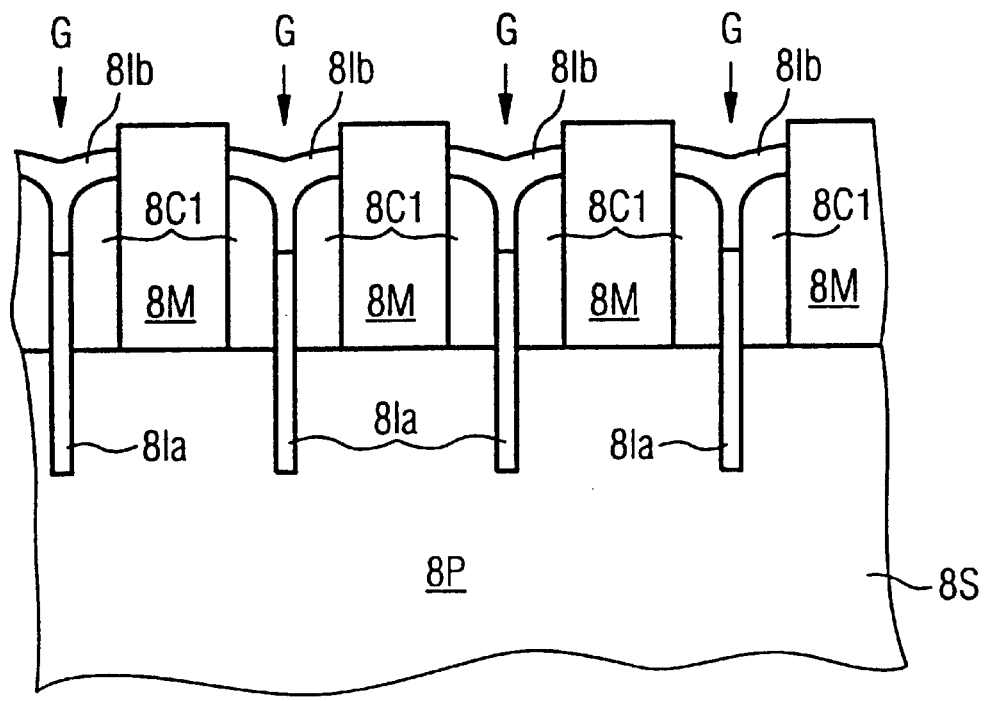
FIG. 17A shows the cross section of FIG. 16A, after first insulating structures and second insulating structures have been created.

To create first insulating structures 8I$a$, $SiO_2$ is deposited to a thickness of approximately 10 nm and etched isotropically, for instance with HF, to approximately 10 nm deep, so that between parts of the mask 8M adjacent one another in the x axis x, the first insulating structures 8I$a$ are created in the trenches G (see FIG. 17A).

Figure 17B:
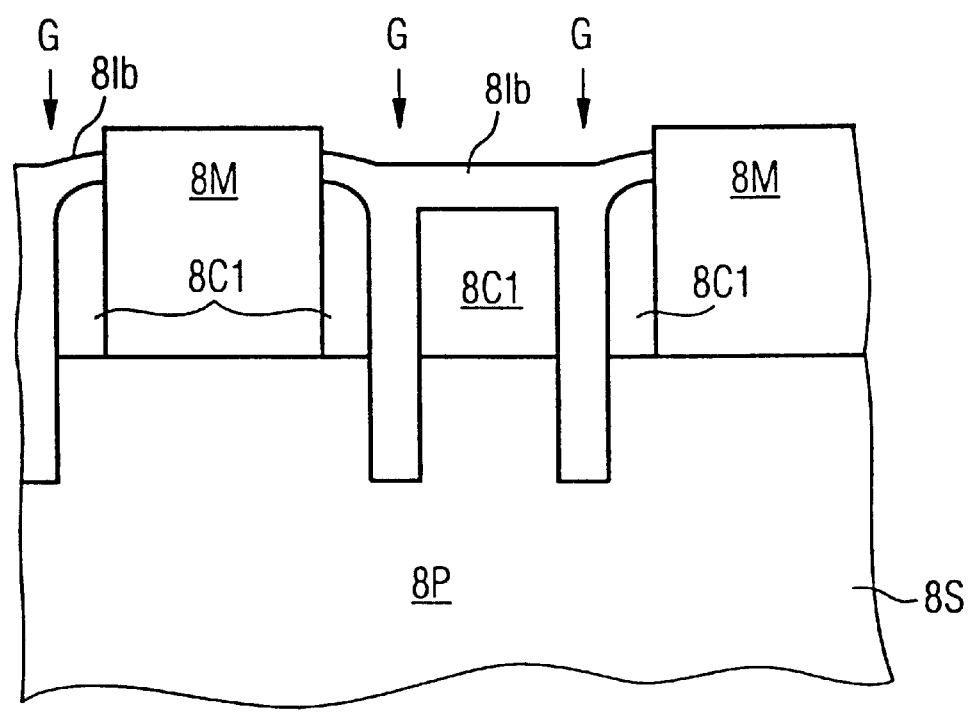
FIG. 17B shows the cross section of FIG. 16B after the process steps of FIG. 17A have been performed.

To create a second insulating structure 8I$b$, silicon nitride is deposited to a thickness of approximately 200 nm and etched back approximately 200 nm deep, for instance with $C_2F_6+O_2$. The second insulating structure 8I$b$ covers the spacers 8C1 and the first insulating structures 8I$a$ and fills portions of the trenches G (see FIGS. 17A and 17B).

Next, by etching, for instance with $CHF_3+O_2$, selectively to the silicon nitride, the mask 8M is removed. By etching of silicon, for instance with HBr+HF, first indentations 8V approximately 10 $\mu$m deep are created. The second insulating structure 8I$b$ serves in this process as a mask (see FIGS. 18A and 18B).

Figure 18A:
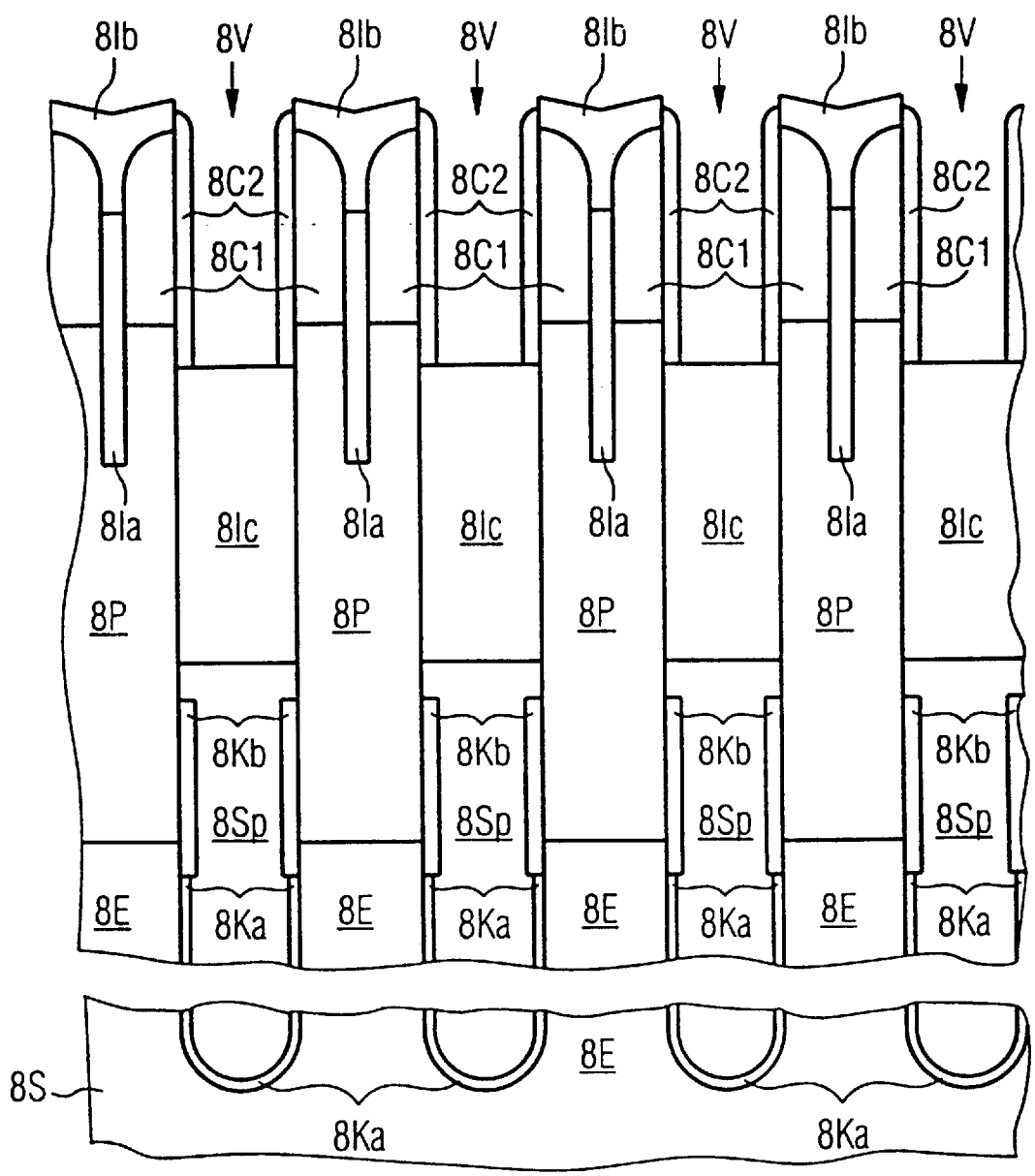
FIG. 18A shows the cross section of FIG. 17A, after first indentations, a capacitor electrode, a capacitor dielectric, memory nodes, third insulating structures, and second spacers have been created.

As in the first exemplary embodiment, a capacitor electrode 8E, a capacitor dielectric 8K$a$, 8K$b$, and memory nodes 8S$p$ are created (see FIGS. 18A and 18B).

To create third insulating structures 8I$c$, $SiO_2$ is deposited to a thickness of approximately 200 nm and back-etched approximately 550 nm deep. The third insulating structures 8I$c$ are disposed in the first indentations 8V on the memory nodes 8S$p$ and extend to a level of approximately 50 nm below a surface 8$f$ of the ninth substrate 8S (see FIGS. 18A and 18B).

For creating second spacers 8C2, silicon nitride is deposited to a thickness of approximately 20 nm and back-etched. The second spacers 8C2 are disposed in the first indentations 8V (see FIGS. 18A and 18B).

Next, the third insulating structures 8I$c$ are enlarged, by depositing $SiO_2$ to a thickness of approximately 200 nm and planarizing it together with the silicon nitride by chemical-mechanical polishing, until the surface 8$f$ is exposed (see FIGS. 18A and 18B). In the process, the first spacers 8C1, upper portions of the first insulating structures 8I$a$, upper portions of the second spacers 8C2, and the second insulating structure 8I$b$ are removed (see FIGS. 19A and 19B).

Figure 19A:
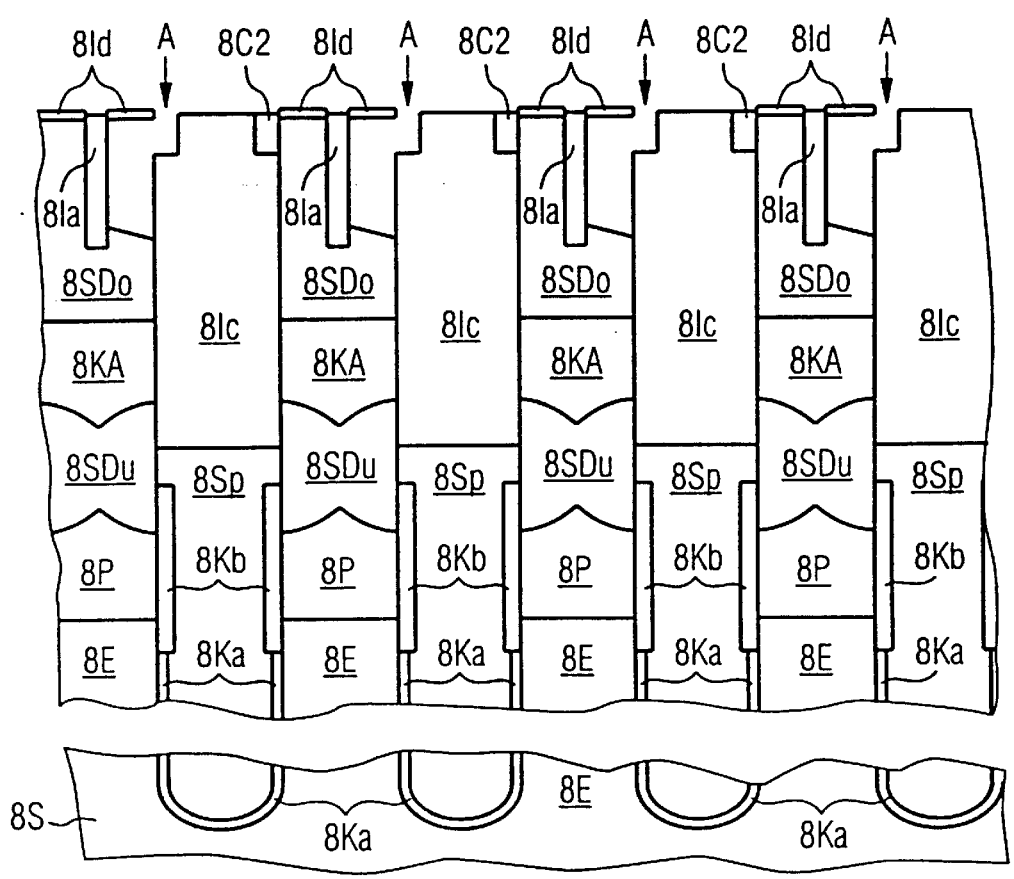
FIG. 19A shows the cross section of FIG. 18A, after the third insulating structures have been enlarged; after the first spacers, upper parts of the first insulating structures, the second insulating structure, and parts of the second spacers have all been removed; and after and insulation trenches with insulators (shown in FIG. 19B), fourth insulating structures, upper source/drain regions, channel regions, lower source/drain regions, and recesses have all been created.
Figure 19B:
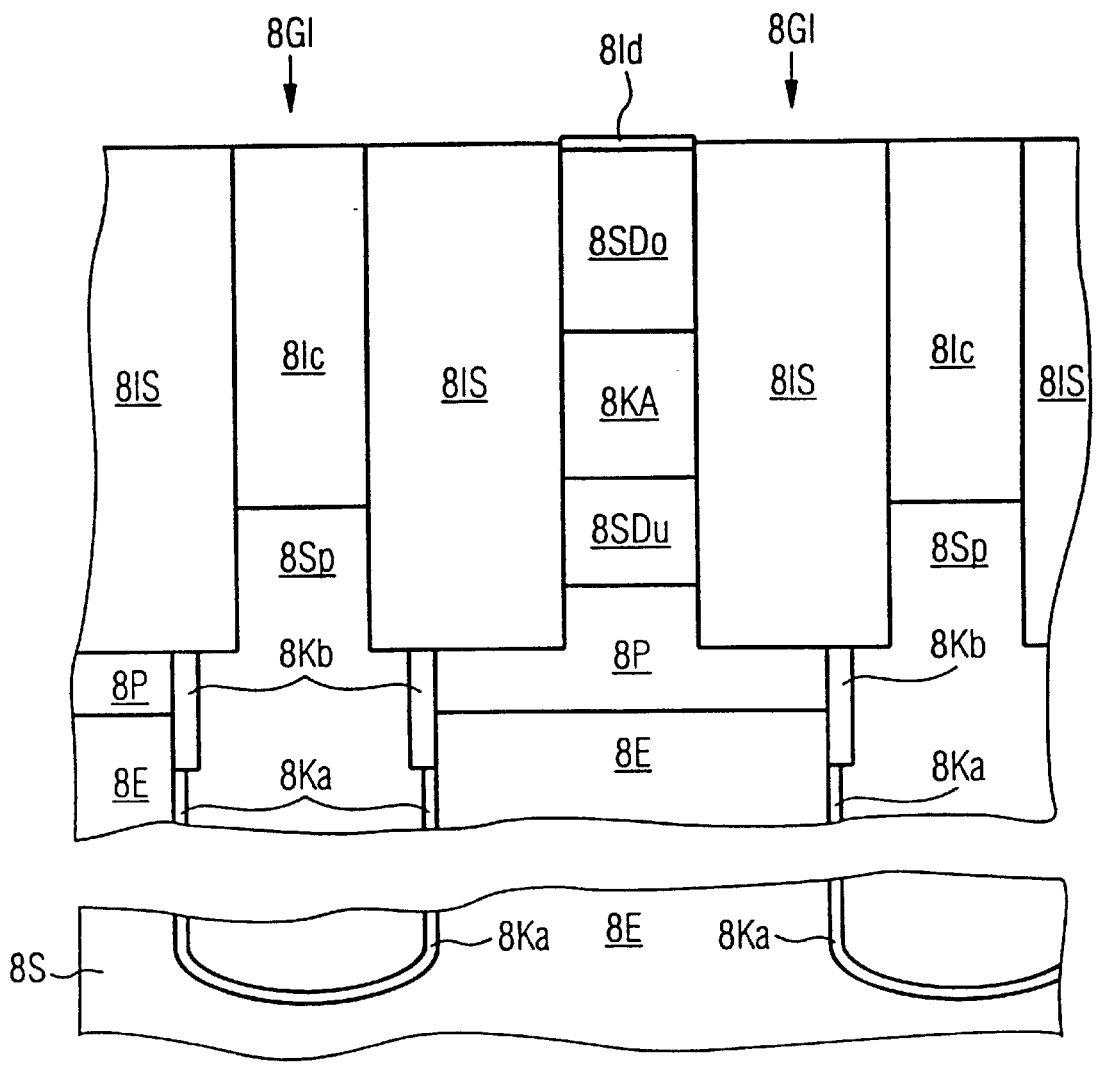
FIG. 19B shows the cross section of FIG. 18B, after the process steps of FIG. 19A have been performed.

With the aid of a second photoresist mask (not shown), by etching with $NF_3+Ar$, insulation trenches 8GI approximately 900 nm deep are created, which are disposed like the insulation trenches GI of the first exemplary embodiment (see FIG. 19B). As in the first exemplary embodiment, in the insulation trenches 8GI, insulators 8IS are created, and by implantation or out-diffusion, upper source/drain regions 8SD$o$ and lower source/drain regions 8SD$u$ of transistors are created (see FIGS. 19A and 19B). Portions of the p-doped layer 8P that are located between the upper source/drain regions SD$o$ and the lower source/drain regions SD$u$ serve as channel regions 8KA of the transistors.

By a thermal oxidation, fourth insulating structures 8I$d$ are created on the upper source/drain regions 8SD$o$ (see FIGS. 19A and 19B).

With the aid of a third photoresist mask (not shown), which is equivalent to the third mask Mc of the first exemplary embodiment, silicon nitride is etched selectively, for instance with $C_2F_6+O_2$, to $SiO_2$, so that the second spacers 8C2, which are disposed at first flanks 8Fa of the first indentations 8V, are removed (see FIG. 19A).

Next, silicon is etched isotropically approximately 100 nm deep selectively to silicon nitride and $SiO_2$, creating recesses A in the ninth substrate 8S, which adjoin the first flanks 8Fa of the first indentations 8V (see FIG. 19A). The recesses A in the ninth substrate 8S are approximately 70 nm wide along the x axis x, because the third insulating structures 8Ic and the first insulating structures 8Ia act as an etch stop. The formation of corresponding recesses in the ninth substrate 8S at second flanks 8Fb of the first indentations 8V, that is, flanks opposite the first flanks 8Fa of the first indentations 8V, is averted by the remaining second spacers 8C2 and the fourth insulating structures.

Next, the third photoresist mask is removed. By etching back $SiO_2$ approximately 20 nm deep, the fourth insulating structures 8Id are removed. The remaining second spacers 8C2 are removed, for instance with $H_3PO_4$.

Figure 20A:
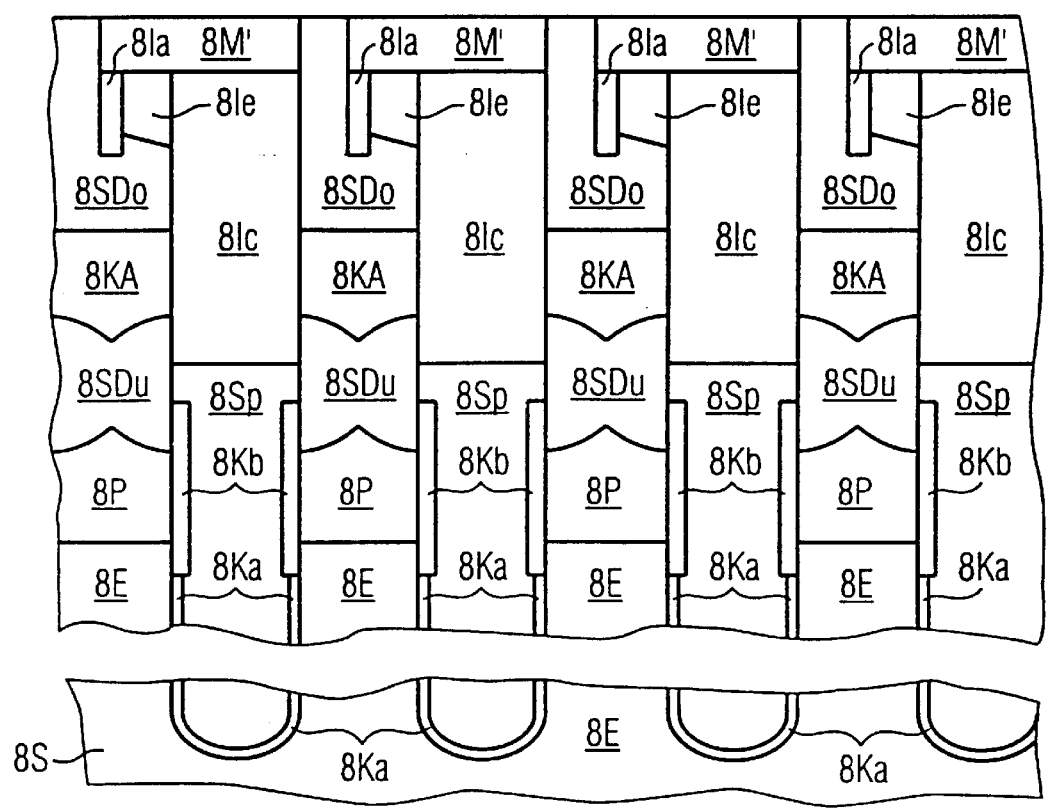
FIG. 20A shows the cross section of FIG. 19A, after the fourth insulating structures and the second spacers have been removed and the fifth insulating structures and a further mask have been created.

For creating fifth insulating structures 8Ie, $Sio_2$ is deposited to a thickness of approximately 200 nm and planarized by chemical-mechanical polishing, until the surface 8f is exposed (see FIG. 20a). The fifth insulating structures 8Ie fill the recesses A in the ninth substrate 8S.

Figure 20B:
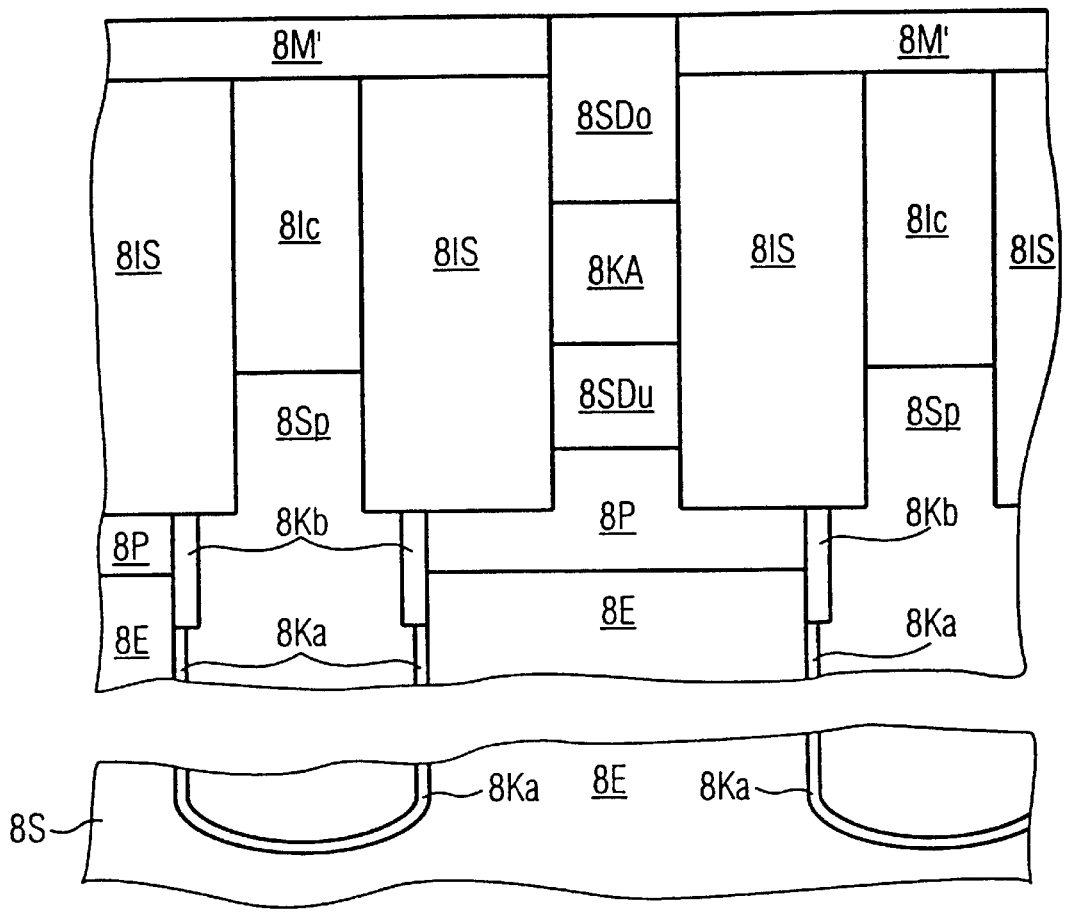
FIG. 20B shows the cross section of FIG. 19B, after the process steps of FIG. 20a have been performed.

By back-etching of $SiO_2$ selectively to silicon, the insulators 8IS, the first insulating structures 8Ia, the third insulating structures 8Ic, and the fifth insulating structures 8Ie are removed to a thickness of approximately 80 nm and are replaced by a further mask 8M', by the deposition of silicon nitride to a thickness of approximately 200 nm and planarization by chemical-mechanical polishing, until the surface 8f is exposed (see FIGS. 20a and 20b).

Figure 21A:
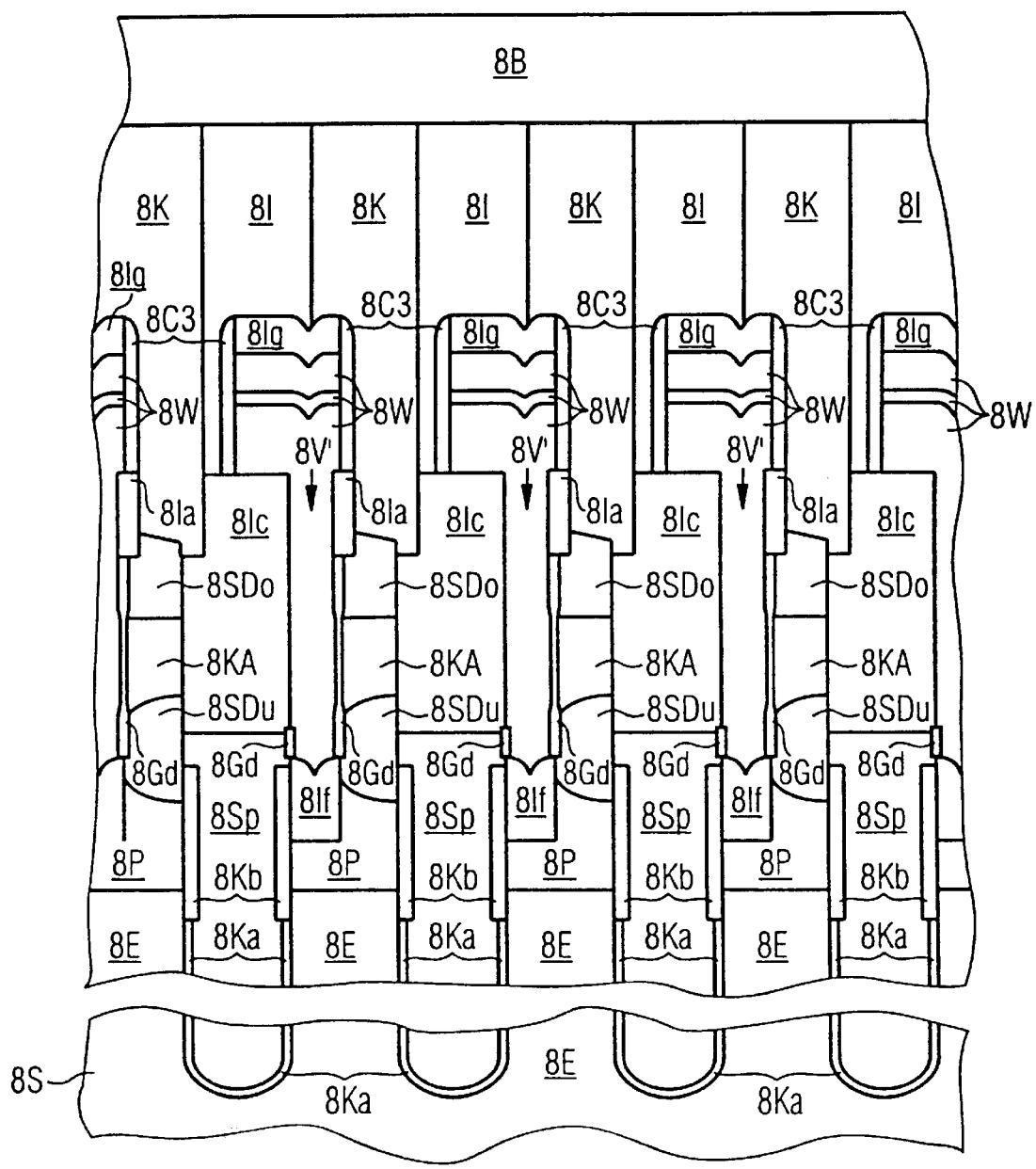
FIG. 21A shows the cross section of FIG. 20A, after second indentations, sixth insulating structures, a gate dielectric, word lines, seventh insulating structures, third spacers, an insulating layer, contacts, and bit lines have been created, and after the fifth insulating structures have been removed.
Figure 21B:
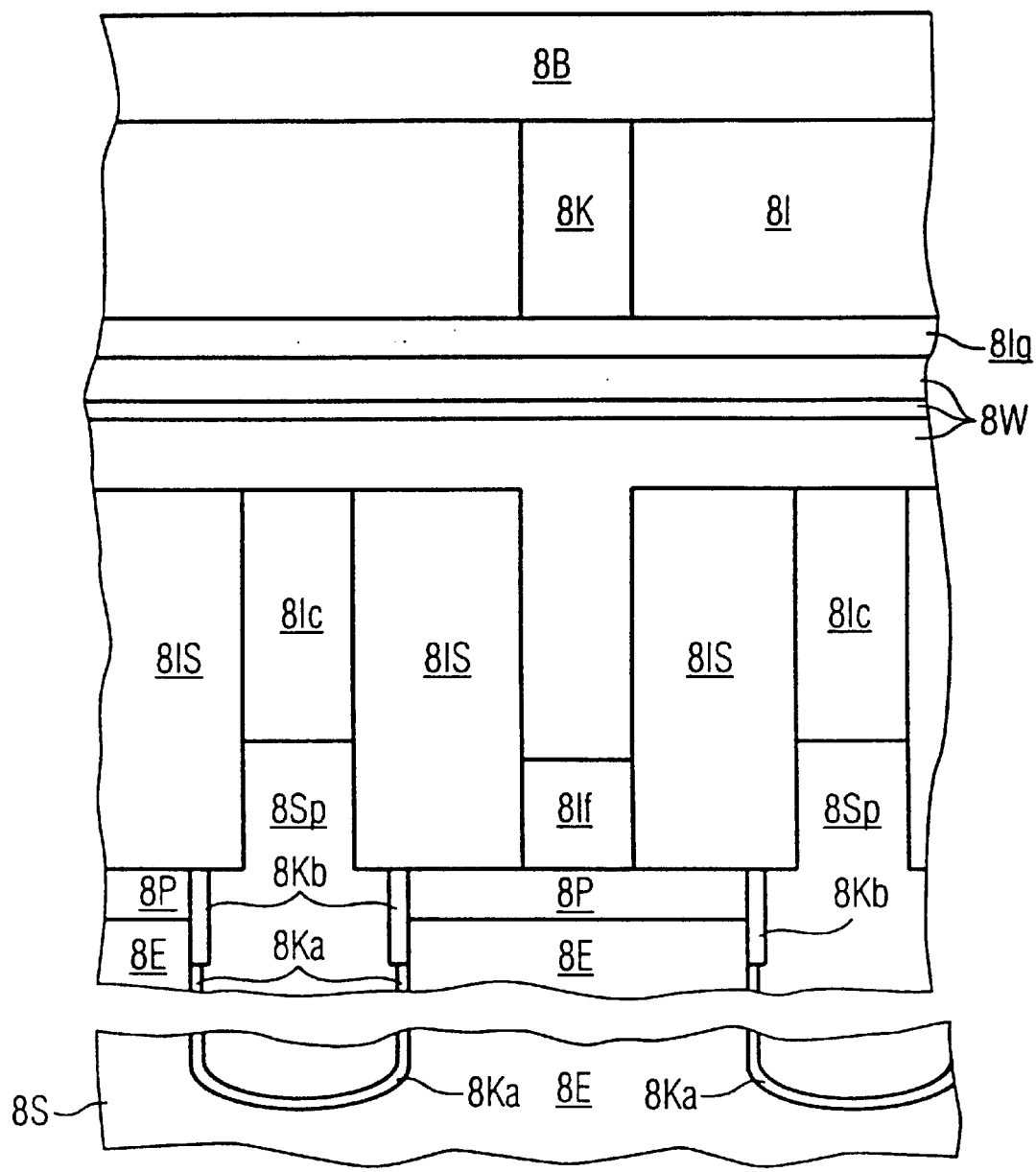
FIG. 21B shows the cross section of FIG. 20B, after the process steps of FIG. 21A have been performed.

With the aid of the further mask 8M', by etching of silicon selectively to silicon nitride, for instance with $C_2F_2+O_2$, second indentations 8V' are created outside the first indentations 8V (see FIGS. 21A and 21B). The second indentations 8V' adjoin the second flanks 8Fb of the first indentations 8V. The junction depth of the transistors is 80 nm and is determined by the further mask 8M' and consequently, in the final analysis, by the first insulating structures 8Ia. In contrast to the other exemplary embodiments, the capacitor dielectric 8Ka, 8Kb at the second flanks 8Fb of the first indentations 8V has further recesses, on which the second indentations 8V' are not superimposed.

On bottoms of the second indentations 8V', sixth insulating structures 8If are created, by depositing $SiO_2$ to a thickness of approximately 200 nm and back-etching it approximately 600 nm deep (see FIGS. 21A and 21B).

By etching of silicon nitride, for instance with $C_2F_6+O_2$, the further mask 8M' is removed.

For creating a gate dielectric 8Gd approximately 4 nm thick, a thermal oxidation is performed (see FIG. 21A).

Next, in situ n-doped polysilicon is deposited to a thickness of approximately 100 nm, so that the second indentations 8V' are filled. Over that, tungsten nitride is deposited to a thickness of approximately 20 nm. Over that, tungsten is deposited to a thickness of approximately 100 nm. Over that, silicon nitride is deposited to a thickness of approximately 100 nm. To create word lines 8W that are covered by seventh insulating structures 8Ig, silicon nitride, tungsten, tungsten nitride and polysilicon are structured (see FIGS. 21A and 21B) with the aid of a striplike photoresist mask (not shown) that matches the corresponding photoresist mask of the second exemplary embodiment.

For encapsulating the word lines 8W, third spacers 8C3 are created, by depositing silicon nitride to a thickness of approximately 50 nm and back-etching it.

As in the second exemplary embodiment, an insulating layer 8I, contacts 8K, and bit lines 8B are created (see FIGS. 21A and 21B).

Many variations of the exemplary embodiments that are also within the scope of the invention are conceivable. For instance, the dimensions of the layers, features, indentations, and masks can be adapted to given requirements. The same is true for the dopant concentration and for the choice of materials.

If the DRAM cell configuration has open bit lines, then the word line can be created by first depositing in situ doped polysilicon to a thickness that does not fill up the word line trenches, and then depositing a material with a higher electrical conductivity, such as tungsten, so that the word line trenches are filled. The tungsten and the polysilicon can be structured together and can form the word lines.

Instead of diffusion of dopant out of the memory nodes for creating the lower source/drain regions, the lower source/drain regions can be created by structuring of a doped layer of the substrate. The doped layer along with further layers, from which the channel regions and the upper source/drain regions are created, can be created by epitaxy. The same is true for the capacitor electrode.

The first layer a, the second layer b, and the third layer c of the sixth exemplary embodiment can alternatively be created by performing an implantation with n-doped ions, beginning at the sixth substrate 5S, using an energy such that the second layer b is created as a buried layer in the sixth substrate 5S, at a depth of between 200 nm and 400 nm. By an implantation with p-doped ions, in which the ions can penetrate to a depth of approximately 1 $\mu$m into the sixth substrate 5S, the first layer a is created under the second layer b, and the third layer c is created above the second layer b. The implantations can also be performed after the indentations have been created.

Characteristics of the nine exemplary embodiments can be combined with one another. For instance, the fourth and sixth exemplary embodiments can be modified such that instead of folded bit lines, open bit lines are created, which either protrude from the substrate, as in the second exemplary embodiment, or are buried in the substrate, as in the third exemplary embodiment. The fifth exemplary embodiment can be modified such that the DRAM cell configuration has folded bit lines or open bit lines with buried word lines.

We claim:

1. A DRAM cell configuration, comprising:
    a substrate and memory cells each including at least one vertical transistor and one capacitor, a first indentation and a second indentation;
    said first indentation and said second indentation being laterally offset from one another, with said second indentation of a first memory cell adjoining said first indentation of an adjacent, second memory cell and adjoining said substrate;
    an upper source/drain region, a channel region, and a lower source/drain region of said transistor being disposed in said substrate, one above the other, and each adjoining a first flank of said first indentation and adjoining said second indentation;
    a capacitor dielectric of said capacitor formed on at least a portion of said first flank of said first indentation, said dielectric having a recess formed therein in a region of said lower source/drain region of said transistor, and wherein a bottom of said second indentation is located lower than a lower edge of said recess;

said capacitor having a memory node disposed in said first indentation, and said node in said recess adjoining said lower source/drain region of said transistor;

said transistor having a gate electrode disposed in said second indentation; and a word line connected to said gate electrode of said transistor of said memory cell, and a bit line extending transversely to said word line and connected to said upper source/drain region.

2. The DRAM cell configuration according to claim 1, wherein said second indentation of said first memory cell adjoins said memory node disposed in said first indentation of said second memory cell.

3. The DRAM cell configuration according to claim 2, wherein said memory node has an upper face defining an upper edge of said recess; and an insulating structure is disposed on said memory node, in said first indentation.

4. The DRAM cell configuration according to claim 3, wherein said second indentation of said first memory cell is laterally offset with respect to said first indentation of said second memory cell, such that said second indentation of said first memory cell is disposed partly in said first indentation of said second memory cell and partly in said substrate;

a width of said insulating structure is at least so great as to prevent triggering of said transistor of said second memory cell by one of a gate electrode and a word line adjoining said insulating structure.

5. The DRAM cell configuration according to claim 3, wherein said second indentation of said first memory cell is disposed in said first indentation of said second memory cell and together with said first indentation of said second memory cell shares a portion of a second flank, opposite said first flank, of said first indentation of said second memory cell;

a width of said insulating structure is at least so great as to prevent triggering of said transistor of said second memory cell by one of a gate electrode and a word line adjoining said insulating structure.

6. The DRAM cell configuration according to claim 2, wherein said second indentation of said first memory cell is disposed in said substrate and outside said first indentation of said second memory cell and said second indentation of said first memory cell adjoins a second flank, opposite said first flank, of said first indentation of said second memory cell;

said capacitor dielectric is formed with a further recess on said second flank of said first indentation of said second memory cell, such that said second indentation of said first memory cell adjoins said memory node of said second memory cell.

7. The DRAM cell configuration according to claim 3, wherein said upper source/drain region, said channel region, and said lower source/drain region of said transistor are disposed along a direction defined by said bit lines between said first indentation and said second indentation;

said upper source/drain region and at least a portion of said channel region are disposed along a direction defined by said word lines between two insulators, disposed at least partly in said substrate;

said insulating structure is disposed along the direction defined by said word lines between said two insulators;

said second indentation forming a part of a word line trench adjoining said two insulators;

said gate electrode of said transistor is part of one of said word lines disposed in said word line trench.

8. The DRAM cell configuration according to claim 7, wherein said insulators are disposed in insulation trenches extending transversely to said word line trench;

said insulation trenches having bottoms located at a lower level than a lower edge of said lower source/drain region; and said word line trench is shallower than said insulation trenches.

9. The DRAM cell configuration according to claim 7, wherein said bit lines are folded bit lines;

two of said word lines are disposed in said word line trench; and said word lines are formed as spacers.

10. The DRAM cell configuration according to claim 7, wherein a single word line is disposed in said word line trench.

11. The DRAM cell configuration according to claim 10, wherein said word line protrudes from said word line trench.

12. The DRAM cell configuration according to claim 10, wherein said first indentations are disposed such that memory nodes, adjoining said word line trenches, of adjacent memory cells adjoin a same flank of said word line trench.

13. The DRAM cell configuration according to claim 7, wherein said first indentations are disposed such that memory nodes, adjoining said word line trenches, of adjacent memory cells alternatingly adjoin a first flank and a second flank of said word line trench.

14. The DRAM cell configuration according to claim 1, wherein said lower source/drain region has a highly doped part, surrounded by a low-doped part of said lower source/drain region, such that said highly doped part of said lower source/drain region does not adjoin said substrate and does not adjoin said channel region.

15. A method of producing a DRAM cell configuration, comprising;

forming a first indentation and a second indentation in a substrate, with the first indentation and the second indentation laterally offset from one another;

forming memory cells, each with a vertical transistor and a capacitor, and wherein the second indentation of a first memory cell adjoins the first indentation of an adjacent second memory cell and adjoins the substrate;

forming transistors in the substrate, with a lower source/drain region, a channel region, and an upper source/drain region disposed one above the other;

wherein the first indentation is formed in the substrate such that a first flank of the first indentation adjoins the lower source/drain region, the channel region, and the upper source/drain region;

forming a capacitor dielectric of a capacitor in the first indentation;

providing the capacitor dielectric with a recess on the first flank of the first indentation, in a region of the lower source/drain region;

creating a memory node of the capacitor in the first indentation, wherein the node in the recess adjoins the lower source/drain region;

wherein the second indentation is formed to adjoin the upper source/drain region, the channel region, and the lower source/drain region, and a bottom of the second indentation is located lower than a lower edge of the recess;

forming a gate electrode of the transistor in the second indentation;

creating a word line and a bit line extending transversely to the word line; and connecting the gate electrode of the transistor to the word line, and connecting the upper source/drain region to the bit line.

16. The method according to claim 15, which comprises forming the memory cells such that the second indentation of the first memory cell adjoins the memory node formed in the first indentation of the second memory cell.

17. The method according to claim 16, which comprises forming the memory node such that an upper face of the memory node defines an upper edge of the recess; and forming an insulating structure on the memory node in the first indentation.

18. The method according to claim 17, which comprises:

forming a mask for creating the first indentation;

creating at least the channel region and the lower source/drain region of the transistor of the first memory cell such that, prior to forming the second indentation of the first memory cell, the channel region and the lower source/drain region adjoin the first indentation of the first memory cell and the first indentation of the second memory cell;

forming a further recess in the capacitor dielectric, at a second flank of the first indentation of the second memory cell opposite the first flank;

subsequently to creating the memory node, creating a further mask, disposed above the first flanks, of the first indentations; and wherein the second indentations are created with the further mask, such that the second indentation of the first memory cell is disposed in the substrate and adjoins the second flank of the first indentation of the second memory cell.

19. The method according to claim 18, which comprises forming the mask to cover the first indentations to be created;

forming trenches between the first indentations to be created, by forming spacers on flanks of the mask and etching the substrate selectively to the mask and to the spacers;

filling the trenches with insulating material;

depositing and back-etching material, such that the material is disposed between parts of the mask;

removing the mask selectively to the material, and forming the first indentations by etching the substrate selectively to the material;

covering the substrate with insulating material;

exposing a portion of the substrate adjoining the first flank of the first indentation of the first memory cell;

isotropically etching the substrate, and filling the trench with insulating material acting as a lateral etch stop, such that a recess is created in the substrate adjoining the first flank of the first indentation of the first memory cell;

filling the recess in the substrate with insulating material; and partly replacing the insulating material and the insulating structure by the further mask, by back-etching the insulating material and the insulating structure, and depositing and planarizing material, until a portion of the substrate is exposed adjoining the second flank of the first indentation of the second memory cell and adjoining the trench.

20. The method according to claim 16, which comprises:

forming at least the channel region and the lower source/drain region of the transistor of the first memory cell such that, prior to forming the first indentation of the first memory cell, the channel region and the lower source/drain region adjoin the first indentation of the first memory cell and the first indentation of the second memory cell;

subsequently to forming the capacitor dielectric, depositing conductive material;

subsequently forming a mask, disposed above the first flanks of the first indentations and not covering the regions above second flanks of the first indentations that are opposite the first flanks;

forming the second indentations with the mask, and etching at least the substrate and the conductive material, such that the second indentation of the first memory cell is disposed partly in the first indentation of the second memory cell and partly in the substrate; and wherein the step of creating the memory node comprises forming the memory node from the conductive material.

21. The method according to claim 19, which comprises:

creating at least the channel region and the lower source/drain region of the transistor of the first memory cell such that, prior to forming the second indentation of the second memory cell, the channel region and the lower source/drain region adjoin the first indentation of the first memory cell and adjoin the first indentation of the second memory cell;

depositing and back-etching conductive material after the step of creating the capacitor dielectric;

forming the second indentations are created such that the second indentation of the first memory cell is disposed in the first indentation of the second memory cell and with the first indentation of the second memory cell shares a portion of the second flank of the first indentation of the second memory cell; and creating the memory node from the conductive material.

22. The method according to claim 21, which comprises:

structuring a first layer on the substrate in accordance with the first indentations;

after the insulating structure is created, applying and structuring a second layer above the first flanks of the first indentations and not covering regions above second flanks, opposite the first flanks, of the first indentations;

utilizing the the first layer and the second layer as masks in the formation of the second indentations.

23. The method according to claim 21, which comprises:

structuring a layer on the substrate in accordance with the first indentations;

creating a spacer on the first flank of the first indentation;

forming the second indentation, and thereby etching selectively to the layer and to the spacer.

24. The method according to claim 15, which comprises:

forming the first indentation and the second indentation such that the upper source/drain region, the channel region, and the lower source/drain region of the transistor are disposed in a direction of the bit lines, between them;

subsequently to the step of forming the capacitor dielectric, depositing conductive material;

subsequently, forming insulation trenches extending substantially parallel to one another and to the bit lines;

wherein the first indentation is intersected by two mutually adjacent, parallel insulation trenches;

filling the insulation trenches with insulators;

forming the second indentations of the memory cells as parts of word line trenches extending substantially parallel to one another, and transversely to the insulation trenches;

wherein the word line trenches are formed by etching at least the insulators in the insulation trenches and the substrate;

forming the gate electrodes of the transistors of the memory cells as parts of the word lines disposed in the word line trenches; and forming the memory node from the conductive material.

25. The method according to claim 24, which comprises, forming the insulation trenches with bottoms disposed at a lower level than the lower source/drain region; and forming the word line trenches shallower than the insulation trenches.

26. The method according to claim 15, which comprises forming substantially parallel insulation trenches and filling the insulation trenches with insulators;

forming the first indentations of the memory cells between the insulation trenches such that the first indentation adjoins two mutually adjacent insulation trenches;

forming the second indentations of the memory cells as parts of word line trenches, extending substantially parallel to one another and extending transversely to the insulation trenches, such that the upper source/drain region, the channel region, and the lower source/drain region of the transistor are disposed between the second indentation and the first indentation; and producing the gate electrodes of the transistors of the memory cells as parts of the word lines disposed in the word line trenches.

27. The method according to claim 26, which comprises:

forming the insulation trenches with bottoms disposed at a lower level than the lower source/drain region; and forming the word line trenches shallower than the insulation trenches.

28. The method according to claim 15, which comprises forming a single word line in each of the word line trenches.

29. The method according to claim 28, wherein the step of forming the word lines comprises depositing and structuring material, so that the word lines protrude from the word line trenches.

30. The method according to claim 28, which comprises forming the memory cells such that memory nodes, which adjoin one of the word line trenches, of adjacent memory cells adjoin a common flank of the word line trench.

31. The method according to claim 24, which comprises forming the memory cells such that the memory nodes, which adjoin one of the word line trenches, of adjacent memory cells alternatingly adjoining a first flank and a second flank of the word line trench.

32. The method according to claim 15, which comprises:

subsequently to forming the first indentation, depositing at least a portion of the capacitor dielectric substantially conformally, and thereby covering faces of the first indentation without filling the first indentation;

filling the first indentation with conductive material;

back-etching the conductive material to an upper level;

removing exposed parts of the capacitor dielectric and parts of the capacitor dielectric located between the upper level and a lower level, below the upper level, and thereby forming recess of the capacitor dielectric between the lower level and the upper level;

depositing further conductive material and back-etching the further conductive material to the upper level;

performing a tempering step to create the lower source/drain region, and thereby out-diffusing dopant of the conductive material into the substrate in the region of the recess; and producing the memory node from the conductive material.

33. The method according to claim 15, which comprises:

forming a low-doped part of the lower source/drain region by structuring a doped layer through the first indentations, the second indentations, and the insulation trenches; and producing a highly doped part of the lower source/drain region by out-diffusing dopant from the memory node, wherein the low-doped part surrounds the highly doped part and the highly part does not adjoin the substrate and does not adjoin the channel region.

* * * * *